(12) United States Patent
Miyagawa

(10) Patent No.: US 12,065,602 B2
(45) Date of Patent: Aug. 20, 2024

(54) PHOSPHOR COMPOSITIONS WITH ORANGE AND AMBER LIGHT EMISSION

(71) Applicant: OSRAM Opto Semiconductors GmbH, Regensburg (DE)

(72) Inventor: Hiroaki Miyagawa, Epping, NH (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 105 days.

(21) Appl. No.: 17/555,605

(22) Filed: Dec. 20, 2021

(65) Prior Publication Data

US 2023/0193128 A1   Jun. 22, 2023

(51) Int. Cl.
  C09K 11/77   (2006.01)
  H01L 33/26   (2010.01)
  H01L 33/50   (2010.01)

(52) U.S. Cl.
  CPC .... *C09K 11/77744* (2021.01); *C09K 11/7774* (2013.01); *H01L 33/26* (2013.01); *H01L 33/502* (2013.01)

(58) Field of Classification Search
  CPC .......... C09K 11/7774; C09K 11/77744; H01L 33/502
  See application file for complete search history.

(56) References Cited

U.S. PATENT DOCUMENTS

| | | | |
|---|---|---|---|
| 8,207,663 B2 | 6/2012 | Sambandan et al. | |
| 8,968,600 B2 | 3/2015 | Zhang et al. | |
| 9,567,518 B2 | 2/2017 | Miyagawa et al. | |
| 10,093,856 B2 | 10/2018 | Miyagawa et al. | |
| 2016/0355732 A1* | 12/2016 | Miyagawa | ............ C04B 35/638 |

FOREIGN PATENT DOCUMENTS

| | | | |
|---|---|---|---|
| CN | 102492424 | * | 6/2012 |
| CN | 102492424 A | | 6/2012 |
| CN | 110746971 A | | 2/2020 |
| JP | 2009-79094 | * | 4/2009 |

OTHER PUBLICATIONS

Translation for CN 1022492424, Jun. 13, 2016.*
Ohkubo, K., et al., "Absolute Fluorescent Quatum Efficiency of NBS Phosphor Standard Samples", J. Illum. Engng. Inst. Jpn., 1999, vol. 83, issue 2, pp. 87-93.
Yongchao, J., et al., "Color Point Tuning in Lu3-x-y MnxAl5-x SixO12:yCe3+ for White LEDs", ChemPhysChem Articles, 2012, vol. 13, pp. 3383-3387.
Lang, T., et al., "Luminescence properties of color tunable new garnet structure (Llu1-xMnx)3Al2(AL 1-xSix)3O12:CE3 + solid solution phosphors", Journal of Luminescence, 2019, pp. 98-104.

(Continued)

*Primary Examiner* — C Melissa Koslow
(74) *Attorney, Agent, or Firm* — Viering, Jentschura & Partner mbB; Samuel Y. Lo

(57) ABSTRACT

A phosphor, wherein the phosphor has a formula:

$$^{VIII}(Y_{1-x-z-w},Lu_z,Gd_w,Ce_x)_3{}^{VI}(Al_{1-y},Mn_y)_2{}^{IV}(Al_{1-2y/3},Si_{2y/3})_3O_{12},$$

wherein
$0<x\leq 0.05$,
$0<y\leq 0.04$,
$0<x+z<1$,
$0\leq w\leq 0.50$ when $z\neq 0$,
$0\leq w\leq 0.35$ when $z=0$, and
$0<x+z+w\leq 1$, is described. Furthermore, a light-emitting device and methods for preparing the phosphor and the light-emitting device are described.

11 Claims, 14 Drawing Sheets

(56) References Cited

OTHER PUBLICATIONS

Ohkubo, K., et al., "Quantum Efficiency Measurement of Lamp Phosphors in accordane with Radiometric Standards", J. Illum. Engng. Inst. Jpn., 2011, vol. 95, issue 8A, pp. 431-438.

Pasinski, D., et al., "Relationship between structure and luminescence properties in Ce3+ or Ce3+, Mn2-doped garnet phosphors for use in white LEDs", Journal of Luminescence, 2015, 7 pages.

Shi, Y., et al., "Tunable luminescence Y3Al5O12:0.06Ce3+,xMn2+ phosphors with different charge compensators for warm white light emitting diodes", School of Physical Science and Technology, China, 2012, vol. 20, issue 19, 9 pages.

Zhao, C., et al., "Synthesis and luminescence properties of color-tunable Ce, Mn co-doped LuAG transparent ceramics by sintering under atmospheric pressure", Elsevier, 2021, pp. 9156-9163.

\* cited by examiner

US 12,065,602 B2

PHOSPHOR COMPOSITIONS WITH ORANGE AND AMBER LIGHT EMISSION

TECHNICAL FIELD

The present disclosure relates to phosphors, light-emitting devices, methods for preparing phosphors and light-emitting devices.

BACKGROUND

In most lighting applications based on light-emitting diodes (LEDs), the blue light emitted by an InGaN LED is absorbed by a luminescent material (down-conversion phosphor) that can re-emit the absorbed energy in the form of photons with a longer wavelength and lower energy. When down-conversion phosphors are properly chosen, the resulting LED packages can emit light of different colors depending on the specific combination of blue light from the LED plus other colors emitted from one or more phosphors.

For the most part, phosphors come in two forms: as powders of luminescent materials (e.g. phosphors or quantum dots) dispersed in a silicone matrix or as a monolithic ceramics made from the luminescent material itself. The former is usually more economical, while the latter provides much better thermal stability, needed e.g., for high power LED applications where bright sources with a compact structure are of importance.

Different combinations of phosphor produce luminescent materials that absorb and emit light at different wavelengths. Depending on the application requirements in terms of color point and color rendering quality, a particular combination of phosphors is selected. Thus, it is important to have access to a large portfolio of phosphors with properties that fit any given applications.

Phosphors and phosphor compositions are disclosed e.g., in U.S. Pat. No. 8,207,663 B2, U.S. Pat. No. 8,968,600 B2, U.S. Pat. No. 10,093,856 B2, US 2016/0355732 A1 and CN 110746971 A.

Garnet phosphors are disclosed e.g., in Jia at el., Chem Phys Chem 2012, 13, pp. 3383-3387, Pasiński et al., J. Lumin 2016, Volume 169, Part B, pp. 862-867, and Lang et al., J. Lumin 2019, 207, pp. 98-104.

SUMMARY

It is an object to obviate the disadvantages of the prior art.

It is another object to provide a phosphor, wherein the phosphor has a formula:

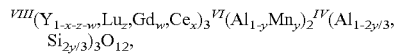

$^{VIII}(Y_{1-x-z-w}Lu_zGd_wCe_x)_3{}^{VI}(Al_{1-y}Mn_y)_2{}^{IV}(Al_{1-2y/3}Si_{2y/3})_3O_{12}$, wherein
0<x≤0.05,
0<y≤0.04,
0<x+z<1,
0≤w≤0.50 when z≠0,
0≤w≤0.35 when z=0, and
0<x+z+w≤1.

It is a further object to provide a light emitting device comprising: a LED die, and at least one phosphor according to the present Disclosure.

It is a further object to provide a method for preparing a phosphor of the present Disclosure, the method comprising the steps of preparing a mixture of ceramic precursors, wherein the ceramic precursors are selected from oxides of single and/or multi-metallic element(s) including Y, Ce, Al, Gd, Lu, Mn and Si, carbonates with Ce and/or Mn, nitrates of Y, Ce, Al, Gd, Lu, and Mn, hydroxides of Y, Ce, Al, Gd, Lu, and Mn, organometallic compounds of Y, Ce, Al, Gd, Lu, and Mn, silicates, and a combination thereof; and heating the mixture at a temperature of higher than 1600° C.

It is a further object to provide a method for preparing a light emitting device according to the present Disclosure, the method comprising the steps of: providing a LED die, and attaching a wavelength converting element, comprising a phosphor of the present Disclosure, to the LED die.

In accordance with one object, there is provided a use of a phosphor of the present Disclosure includes illumination, visualization, general lighting, automotive lighting, and sensing.

Herein described is a phosphor of a specific formula, especially a phosphor of a garnet structure with Ce- and Mn-co-doping showing orange and amber emission (i.e., emission from about 500 nm to about 850 nm).

Furthermore, herein described is a light-emitting device comprising the phosphor, a method for preparing the phosphor and a method for preparing a light-emitting device.

BRIEF DESCRIPTION OF THE DRAWINGS

FIG. 4A refers to Example 2, FIG. 4B refers to Example 5.

FIG. 5A refers to Comparative Example 1 depending on different emission wavelengths at 530 nm, 570 nm, and 610 nm, FIG. 5B refers to Example 1 depending on different emission wavelengths at 530 nm, 570 nm, and 610 nm, FIG. 5C refers to Example 2 depending on different emission wavelengths at 530 nm, 570 nm, and 610 nm, FIG. 5D refers to Example 5 depending on different emission wavelengths at 530 nm, 570 nm, and 610 nm, FIG. 5E refers to a comparison between Examples 2 and 5 and Comparative Example 1 at 610 nm emission wavelength.

FIG. 6A refers to a comparison between Examples 1, 3, and 5, and Comparative Example 1, in which the main 8-coordination metallic element is yttrium (Y). FIG. 6B refers to a comparison between Examples 9 and 12, and Comparative Example 2, in which the main 8-coordination metallic element is lutetium (Lu).

DETAILED DESCRIPTION

Figure 1:
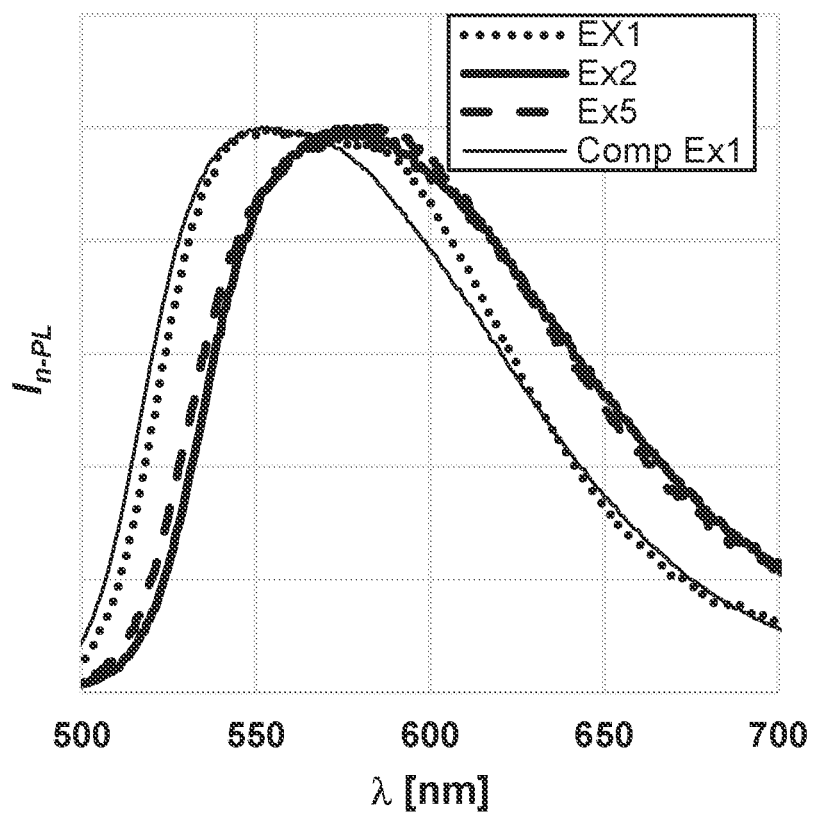
FIG. 1 shows normalized emission spectra of Examples 1, 2, and 5, as well as Comparative Example 1, at 450 nm wavelength excitation.

For a better understanding, together with other and further objects, advantages and capabilities thereof, reference is made to the following disclosure and appended claims taken in conjunction with the above-described drawings.

References to the color of the phosphor, LED, or light-emitting device refer generally to its emission color unless otherwise specified. Thus, a blue LED emits a blue light, a yellow phosphor emits a yellow light and so on.

The present Disclosure is directed to a phosphor, wherein the phosphor has a formula:

$$^{VIII}(Y_{1-x-z-w},Lu_z,Gd_w,Ce_x)_3{}^{VI}(Al_{1-y},Mn_y)_2{}^{IV}(Al_{1-2y/3},Si_{2y/3})_3O_{12},$$

wherein

0<x≤0.05,
0<y≤0.04,
0<x+z<1,
0≤w≤0.50 when z≠0,
0≤w≤0.35 when z=0, and
0<x+z+w≤1.

A phosphor is a material that converts light of a certain first wavelength to light of a certain second wavelength.

The phosphor of the present Disclosure relates to the general group of garnets. A prototypical garnet is originally a silicate of a certain crystallographic structure. The same garnet structure was amended to obtain a synthetic garnet without silicon atoms. Well-known synthetic garnets are yttrium-aluminum-garnets (YAG) of the general formula $Y_3Al_5O_{12}$. The lattice sites of each of Y and Al may be substituted at least in part with further atoms and thus variants of garnets of the general formula $Y_3Al_5O_{12}$ occur. The general crystal structure may further be doped with one or more different atoms to control the emission wavelength (i.e., the certain second wavelength).

According to the present Disclosure, the phosphor has a formula:

$$^{VIII}(Y_{1-x-z-w},Lu_z,Gd_w,Ce_x)_3{}^{VI}(Al_{1-y},Mn_y)_2{}^{IV}(Al_{1-2y/3},Si_{2y/3})_3O_{12},$$

wherein

0<x≤0.05,
0<y≤0.04,
0<x+z<1,
0≤w≤0.50 when z≠0,
0≤w≤0.35 when z=0, and
0<x+z+w≤1.

The numbers VIII, VI, IV in the formula indicate the 8-, 6-, and 4-coordination of the metallic components in the garnet crystal structure.

The index "x" in the formula is between more than 0 and 0.05. The index "x" may further be defined as 0.01≤x≤0.04, more preferably 0.02≤x≤0.03.

The index "y" in the formula is between more than 0 and 0.04. The index "y" may further be defined as 0.0005≤y≤0.025, preferably 0.001≤y≤0.03, or more preferably 0.004≤y≤0.03, or even more preferably 0.007≤y≤0.025.

The index "w" is 0≤w≤0.50 when z≠0 and 0≤w≤0.35 when z=0. The index "w" may further be defined as 0.3≤w≤0.5 when z≠0. The index "w" may further be defined as 0≤w≤0.49 when z=0.

In an embodiment, the index "w" may further be defined as:

0.10≤w≤0.50 when z≠0, and
0.10≤w≤0.35 when z=0.

In a further embodiment, the index "z" is defined as z=0. In embodiments, wherein z=0, there is no lutetium (Lu) in the phosphor.

In a further embodiment, the sum of indices "x", "z" and "w" is 1 and z≠0. In these embodiments, there is no Y, but Lu in the phosphor.

In an embodiment, the phosphor is selected from:

$^{VIII}(Y_{0.980},Ce_{0.980})_3{}^{VI}(Al_{0.97525},Mn_{0.02475})_2{}^{IV}(Al_{0.9835},Si_{0.0165})_3O_{12};$ $^{VIII}(Y_{0.637},Gd_{0.343},Ce_{0.020})_3{}^{VI}(Al_{0.9925},Mn_{0.0075})_2{}^{IV}(Al_{0.995},Si_{0.005})_3O_{12},$ $^{VIII}(Y_{0.637},Gd_{0.343},Ce_{0.020})_3{}^{VI}(Al_{0.985},Mn_{0.015})_2{}^{IV}(Al_{0.99},Si_{0.01})_3O_{12};$ $^{VIII}(Y_{0.637},Gd_{0.343},Ce_{0.020})_3{}^{VI}(Al_{0.98875},Mn_{0.01125})_2{}^{IV}(Al_{0.9925},Si_{0.0075})_3O_{12};$ $VIII(Y_{0.637},Gd_{0.343},Ce_{0.020})_3{}^{VI}(Al_{0.97525},Mn_{0.02475})_2{}^{IV}(Al_{0.9835},Si_{0.0165})_3O_{12};$ $VIII(Y_{0.8085},Gd_{0.1715},Ce_{0.020})_3{}^{VI}(Al_{0.97525},Mn_{0.02475})_2{}^{IV}(Al_{0.9835},Si_{0.0165})_3O_{12};$ $^{VIII}(Lu_{0.485},Gd_{0.485},Ce_{0.030})_3{}^{VI}(Al_{0.97525},Mn_{0.02475})_2{}^{IV}(Al_{0.9835},Si_{0.0165})_3O_{12};$ $^{VIII}(Lu_{0.490},Gd_{0.490},Ce_{0.020})_3{}^{VI}(Al_{0.97525},Mn_{0.02475})_2{}^{IV}(Al_{0.9835},Si_{0.0165})_3O_{12};$ $^{VIII}(Lu_{0.735},Gd_{0.245},Ce_{0.020})_3{}^{VI}(Al_{0.97525},Mn_{0.02475})_2{}^{IV}(Al_{0.9835},Si_{0.0165})_3O_{12};$ $VIII(Y_{0.425},Lu_{0.163},Gd_{0.392},Ce_{0.020})_3{}^{VI}(Al_{0.97525},Mn_{0.02475})_2{}^{IV}(Al_{0.9835},Si_{0.0165})_3O_{12};$ $VIII(Y_{0.212},Lu_{0.327},Gd_{0.441},Ce_{0.020})_3{}^{VI}(Al_{0.97525},Mn_{0.02475})_2{}^{IV}(Al_{0.9835},Si_{0.0165})_3O_{12};$ and $VIII(Y_{0.3185},Lu_{0.245},Gd_{0.4165},Ce_{0.020})_3{}^{VI}(Al_{0.97525},Mn_{0.02475})_2{}^{IV}(Al_{0.9835},Si_{0.0165})_3O_{12}.$ According to the formula of the phosphor of the present Disclosure, there are two dopants present. The two dopants present are Ce and Mn. The two dopants are typically used separately in phosphors. Ce is a dopant that typically strongly absorbs light at around 450 nm radiation that blue LEDs can emit. However, the emission of Ce occurs at wavelengths near 540 nm (yellow) so in order to generate amber/red emitting phosphors some of the aluminum atoms in the garnet were replaced with Mn ions which replace the structure and can emit at longer wavelengths and red-shift the emission. The Ce seems to efficiently transfer energy to Mn ions such that the final material is an efficient absorber that emits at longer wavelengths than if only Mn was present.

In some embodiments, the phosphor comprises between about 0.1 at % to about 4.0 at % Cerium ($Ce^{3+}$) doping and 0.05 at % to about 3.0 at % Manganese ($Mn^{2+}$) co-doping. The phosphor alternatively comprises between about 0.5 at % to about 3.0 at % Cerium ($Ce^{3+}$) doping and 0.06 at % to about 2.5 at % Manganese ($Mn^{2+}$) co-doping, preferably between about 1.0 at % to about 2.5 at % Cerium ($Ce^{3+}$) doping and 0.07 at % to about 2.25 at % Manganese ($Mn^{2+}$) co-doping, more preferably 1.5 at % to about 2.2 at % Cerium ($Ce^{3+}$) doping and 0.07 at % to about 2.00 at % Manganese ($Mn^{2+}$) co-doping. Depending on the Mn doping amount, the amount of Si in the garnet crystal structure needs to be adjusted. The at % of the doping and the co-doping refers to the ratio of Ce atoms within all 8-coordination metallic elements and that of Mn atoms within all 6-coordination metallic elements, respectively.

The phosphor of the present disclosure may have emissive characteristics between about 500 nm and about 850 nm, preferably between about 530 nm to about 800 nm, more preferably between about 550 nm to about 750 nm, with a 450 nm light excitation. According to an embodiment of the present invention, the phosphor has a dominant wavelength ($\lambda$dom) of the light emission with 450 nm light excitation within the range of 567 nm<$\lambda$dom<590 nm. The dominant wavelength ($\lambda$dom) of the light emission with 450 nm light excitation may be within the range of 570 nm<$\lambda$dom<585 nm, preferably within the range of 574 nm<$\lambda$dom<582 nm. The color coordination of the light emission may be in the range within $0.425<Cx<0.550$ and $0.425<Cy<0.550$. Alternatively, the color coordination of the light emission may be in the range of $0.455<Cx<0.530$ and $0.450<Cy<0.530$.

The internal quantum efficiency (IQE) is a measure for determining the quality of the phosphor. Higher IQE values are desired as those represent more efficient phosphors, e.g., IQEs higher than 80%, higher than 85%, higher than 90%, or higher than 83%. The IQE of phosphors of the present Disclosure is with 450 nm light excitation, preferably higher than 80%. The IQE was determined according to standard methods. Suitable methods are described e.g, in Ohkubo et al, J. Illum. Engng. Inst. Jpn. 1999, 83(2), pp. 87-93 and Ohkubo et al, J. Illum. Engng. Inst. Jpn. 2011, 95(8A), pp. 431-438.

A further object of the present Disclosure is a light emitting device comprising a LED die, and at least one phosphor according to the present Disclosure.

A LED die is an object that emits light of a certain first wavelength, e.g., blue light.

The light emitting device of the present Disclosure comprises at least one phosphor according to the present Disclosure. Thus, the formula of the phosphor and the embodiments of the phosphor described herein each are phosphors that may be present in a light-emitting device of the present Disclosure.

A further object of the present Disclosure is a method for preparing a phosphor of the present Disclosure, the method comprising the steps of preparing a mixture of inorganic and/or organic precursors, wherein the precursors are selected from oxides of single and/or multi-metallic element(s) including Y, Ce, Al, Gd, Lu, Mn and Si, carbonates with Ce and/or Mn, nitrates of Y, Ce, Al, Gd, Lu, and Mn, hydroxides of Y, Ce, Al, Gd, Lu, and Mn, organometallic compounds of Y, Ce, Al, Gd, Lu, and Mn, silicates, and a combination thereof; and heating the mixture at a temperature of higher than 1600° C.

The mixture of the method of the present Disclosure may be prepared by, but not limited to, a wet ball-milling process. All inorganic precursors are preferably thoroughly mixed.

Precursors are compounds that are starting compounds that lead after reacting to the phosphor with the formula described herein.

In an embodiment, the precursors may be ceramic precursors. Ceramic precursors may be selected from oxides of single and/or multi-metallic element(s) including Y, Ce, Al, Gd, Lu, Mn and Si, carbonates with Ce and/or Mn, hydroxides of Y, Ce, Al, Gd, Lu, and Mn, organometallic compounds of Y, Ce, Al, Gd, Lu, and Mn, silicates, and a combination thereof. Exemplary oxides of single and/or multi-metallic element(s) including Y, Ce, Al, Gd, Lu, Mn and Si are, but not limited to, $Y_2O_3$, $Y_3Al_5O_{12}$, $YAlO_3$, $Y_4Al_2O_9$, $CeO_2$, $Al_2O_3$, $AlCeO_3$, $Gd_2O_3$, $Lu_2O_3$, $Lu_3Al_5O_{12}$, $LuAlO_3$, $Lu_4Al_2O_9$, $Mn_xO_y$ including MnO, $MnO_2$, $MnO_3$, $Mn_2O_3$, $Mn_2O_7$, $Mn_3O_4$ and $Mn_5O_8$, $SiO_2$, $Al_2SiO_5$, and $Mn_3Al_2Si_3O_{12}$. Exemplary carbonates with Ce and/or Mn include, but are not limited to, $Ce_2(CO_3)_3$ and $MnCO_3$. Exemplary nitrates of Y, Ce, Al, Gd, Lu, and Mn include, but are not limited to, $Y(NO_3)_3$, $Ce(NO_3)_3$, $Al(NO_3)_3$, $Gd(NO_3)_3$, $Lu(NO_3)_3$, and $Mn(NO_3)_2$. Exemplary hydroxides of Y, Ce, Al, Gd, Lu, and Mn include, but are not limited to, $Y(OH)_3$, $Ce(OH)_3$, $Al(OH)_3$, $Gd(OH)_3$, $Lu(OH)_3$, $Mn(OH)_2$. Exemplary organometallic compounds of Y, Ce, Al, Gd, Lu, and Mn include, but are not limited to, $Y_2(C_2O_4)_3$, $Ce(CH_3CO_2)_3$, $Ce_2(C_2O_4)_3$, $Ce(C_5H_7O_2)_3$, $Al(CH_3)_3$, $Al(C_2H_5)_3$, $Gd(CH_3CO_2)_3$, $Gd(C_5H_7O_2)_3$, $Lu(CH_3CO_2)_3$, $MnC_2O_4$, and $Mn(CH_3CO_2)_2$. An exemplary silicate is, but not limited to, tetraethyl orthosilicate (TEOS).

In a further step of the method of the present disclosure, the mixture is heated at a temperature of higher than 1600° C. The mixture may be heated at a temperature of higher than 1650° C., preferably at a temperature of higher than 1675° C. Preferably, the mixture is heated at a temperature of less than 1850° C. The resultant phosphor may be in the form of a powder, a ceramics, etc. If the resultant phosphor is in powder form, the particle size is preferably of between about 0.5 μm to about 300 μm.

The heating step may be for a time of about 3 hours to about 60 hours, preferably for about 10 hours to about 30 hours, more preferably for about 16 hours to about 24 hours.

In an embodiment of the present disclosure, the method for preparing a phosphor of the present invention further comprises the step of adding a polymeric binder to the mixture, prior to heating. This embodiment preferably leads to a phosphor in ceramic form.

Exemplary polymeric binders may be a vinyl polymer such as polyvinyl butyral (PVB), polyvinyl alcohol (PVA), polyvinyl chloride (PVC), polyvinyl acetate (PVAc), polyacrylonitrile, a mixture or a copolymer thereof; polyethyleneimine; poly methyl methacrylate (PMMA); vinyl chloride-acetate, or a combination thereof. In some embodiments, an acrylic water-based binder is used. In some embodiments, the acrylic water-based binder comprises between about 20 wt % to about 40 wt % solid components, with respect to the mixture. In some embodiments, the solid components comprise polymer. In some embodiments, the solid components comprise polymer and a plasticizer. In some embodiments, the polymer to plasticizer ratio is between about 3:1 to about 7:1, about 4:1 to about 6:1 or any combination thereof. In some embodiments, the acrylic water-based binder solution is comprised of about 35 wt % solid components, with respect to the acrylic water-based binder solution, where the solid components comprise an acrylic polymer to plasticizer mixing ratio of 4:1.

The method of the present disclosure may further comprise adding a solvent to obtain a uniform mixture by wet mixing/milling process. The solvent is preferably added to facilitate a thorough mixing of the precursors. Exemplary solvents may be water, an organic solvent, including a polar or a non-polar organic solvent such as ethanol, methanol, isopropyl alcohol, acetone, xylenes, cyclohexanone, toluene, and methyl ethyl ketone, etc.

The method of the present Disclosure may also comprise additional steps. In the method, a mixture of ceramic precursors, as mentioned herein, optionally comprising binder(s), may be prepared. The mixture of the ceramic precursors that optionally might comprise one or more solvents, may be casted. An exemplary method is tape casting. A slurry with appropriate viscosity is casted on a releasing substrate, such as e.g., a silicone coated Mylar® (Polyethelene tetraphthalate) substrate, with a doctor blade with an adjustable gap. The thickness of the cast tape can be adjusted by changing the doctor blade gap, slurry viscosity and/or casting speed. The cast tape may be dried at ambient atmosphere with, or without heating the substrate. Green tapes, i.e., tapes with a pre-heated phosphor, with various desired thicknesses may be obtained after evaporation of solvent from the cast slurry. Green tapes can be cut to obtain green sheets in the desired shape and dimension. The cut green sheets may then be assembled by stacking up green sheets together. The total number of green sheets in stacking can be in the range of 2 to 100 depending on the thickness of single green sheet and final target thickness of ceramics after sintering. The stacked green sheets may then be heated depending on the glass transition temperature of used polymeric binders, and then compressed using either a uniaxial press or cold isostatic press (CIP). Green laminates may be obtained after the compression/lamination process. After the lamination step, the mixture might be de-binded and subsequently a Bisque-firing is applied. De-binding in the present field means that optional present binders in the mixture are removed, e.g., by applying an adequate temperature. In a further step, the laminate is Bisque-fired. Bisque-firing is the firing at a certain temperature to obtain preferably a ceramics. In the present case, Bisque-firing may be at a temperature of between about 1000° C. to about 1200° C. Subsequently, the laminate is sintered at a temperature of at least 1600° C., preferably for about 2 hours to about 60 hours. This method may be used for preparing a ceramic wavelength converting element comprising at least one phosphor of the present invention.

In some embodiments, providing a pre-heated phosphor of the present Disclosure (i.e., a green form) comprises mixing at least four precursors disclosed herein. In other embodiments, providing a phosphor pre-heated plate comprises tape casting the mixture made from the precursors to form a tape, wherein the thickness of the tape can range from about 5 µm to about 500 µm. In some embodiments, the green form is de-binded and Bisque-fired to create a polymeric binder-free form prior to heating.

The heating to a temperature of higher than 1600° C., preferably higher than 1650° C., more preferably higher than 1700° C., but even more preferably of less than 1900° C., may be carried out in one step, or in several steps, such as two, three, or more steps, like a cascade-like heating with different temperatures. If there is more than one heating step, the first heating step is preferably at a lower temperature than the second, or further heating step(s). The heating may be understood as a sintering, especially in cases, wherein the obtained phosphor is a ceramics.

In an embodiment, the method for preparing a phosphor of the present Disclosure, may comprise the steps of:
  mixing the precursors and additives (e.g., solvents, binders, etc.) with a ball mill for preparing a precursor mixture and/or a slurry,
  tape-casting the precursor mixture and/or slurry to obtain a coated tape, wherein the additive(s), such as solvents, may be evaporated; the thus coated tape may be defined as a "green form",
  laminating the two or more of the "green forms" to obtain the desired thickness.
  de-binding and Bisque-firing of the laminated "green forms" to remove e.g., organic binders; the de-binding and the Bisque-firing may be carried out as described herein,
  sintering the de-binded and Bisque-fired laminated "green form" to obtain a densified ceramics.

Phosphor properties, such as light absorbing properties of light of a certain first wavelength to emit light of a certain second wavelength, of a ceramics are typically obtained after sintering and not after de-binding and Bisque-firing.

The method for preparing a phosphor according to the present Disclosure leads to a phosphor with an internal quantum efficiency (IQE) with 450 nm light excitation of higher than 80%. The internal quantum efficiency (IQE) with 450 nm light excitation may be higher than 84%, preferably higher than 87%, more preferably higher than 90%. The IQE may be determined as mentioned herein.

It is a further object of the present Disclosure to provide a method for preparing a light emitting device according to the present Disclosure, the method comprising the steps of: providing a LED die, attaching a wavelength converting element, comprising a phosphor of the present Disclosure, to the LED die.

As mentioned herein, a LED die is an object that emits light of a certain first wavelength, e.g., blue light, i.e., light of wavelengths of 400 nm to 480 nm.

In a first step of the method of the present Disclosure, the LED die is provided. In a further step, a wavelength converting element comprising at least one phosphor of the present Disclosure is attached to the LED die.

A wavelength converting element is an element that comprises at least one phosphor that converts light of a certain first wavelength to light of a certain second wavelength. The wavelength converting element may be a ceramics, a single-crystal, or powders.

The wavelength converting element may be attached to the LED die by polymeric glue, including silicone.

In a further aspect, the present Disclosure is directed to a use of a phosphor of the present Disclosure in illumination, visualization, general lighting, automotive lighting, and sensing. The phosphor might be present as, or in a wavelength converting element. Application fields, such as illumination, visualization, general lighting, automotive lighting, and sensing might be defined by the emitting wavelength. E.g., illumination is defined by an emission wavelength which is longer than the LED light wavelength.

In FIG. 1 to FIG. 6A-6B, the indices have the following meaning:
  t: time
  $I_{n-PL}$: Normalized intensity of photoluminescence
  $I_{n-ab}$: Normalized intensity of light absorption
  λ: Light wavelength
  $\lambda_{ex}$: Excitation wavelength
  IQE: Internal quantum efficiency
  $I_{WAXS}$: Intensity of wide angle X-ray diffraction, in counts FIG. 1 shows the normalized emission spectra of Examples 1, 2, and 5 as well as of Comparative Example 1. These emission spectra were measured at 450 nm wavelength excitation. Comparing Example 1 with Mn-co-doping and Comparative Example 1 without Mn-co-doping, the emission of Example 1 was red-shifted due to Mn-co-doping. Comparing Example 1 and Example 5 with 2.45 at % Mn-co-doping, the Example 5 showed the emission shift to the redder side due to 34 at % Gd which replaced Y in the garnet crystal. Comparing Example 2 and Example 5, the reduced Mn-co-doping in Example 2 resulted in narrower emission spectra, maintaining the same $\lambda_{dom}$ regardless of the amount of Mn-co-doping between 0.75 at % and 2.45 at %.

Figure 2:
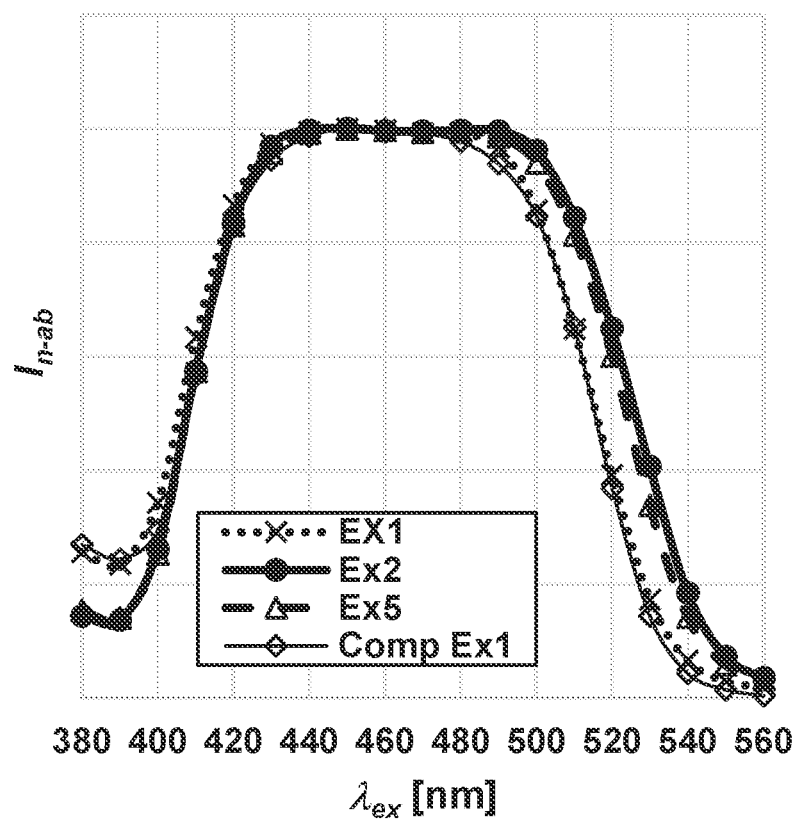
FIG. 2 shows the wavelength dependent light absorption of Examples 1, 2, and 5, as well as Comparative Example 1.

The normalized light absorption of Examples 1, 2, and 5 as well as of Comparative Example 1, depending on different excitation wavelengths, are shown in FIG. 2. The absolute values of the light absorption may be influenced by ceramic size and ceramic thickness. Therefore, also the wavelength range resulting in the down conversion light emission caused by the light absorption is observed, and not only the absolute values of light absorption. Comparing Example 1 with Mn-do-doping and Comparative Example 1 without Mn-co-doping, the range of the light absorption was not significantly changed regardless of Mn-co-doping. Comparing Example 1 and Example 5 with 2.45 at % Mn-co-doping, the Example 5 showed the broader wavelength range of the light absorption due to 34 at % Gd replacing Y in the garnet crystal. Comparing Example 2 and Example 5, the reduced Mn-co-doping in Example 2 resulted in a slightly narrower wavelength range of the light absorption. Regardless of different Mn-co-doping and Gd-co-doping, these compositions are sufficient for the application of blue LED, whose $\lambda_{dom}$ is in the range between 420 nm and 470 nm in general.

Figure 3:
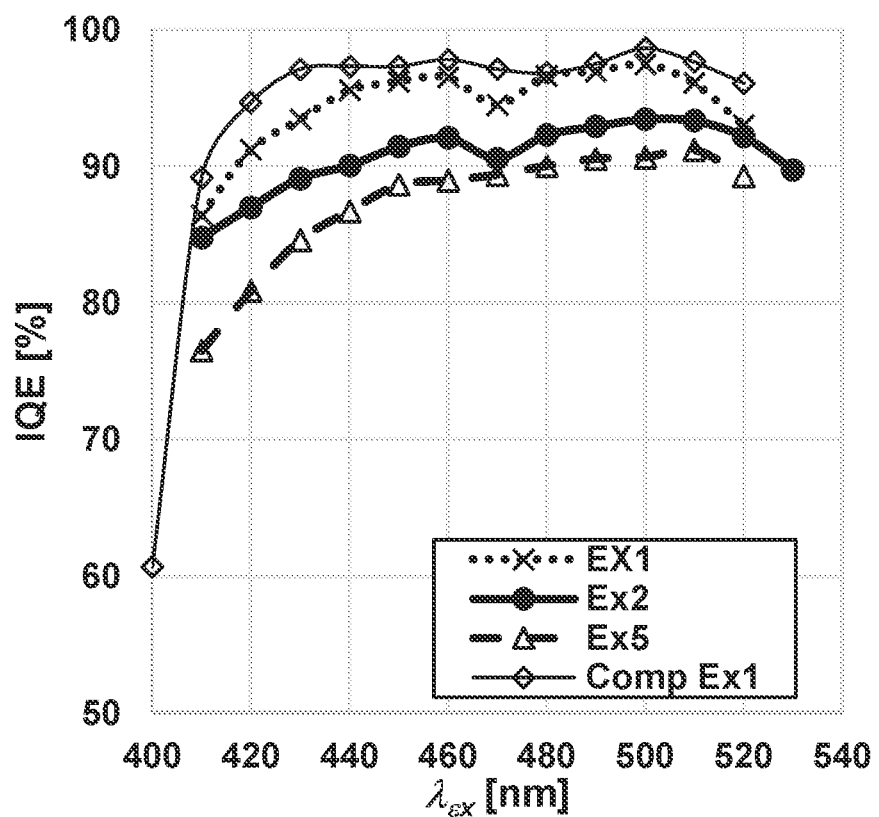
FIG. 3 shows a wavelength dependent IQE of Examples 1, 2, and 5, as well as of Comparative Example 1.

FIG. 3 shows the absolute values of IQE depending on the different excitation wavelengths. These IQE values are presented only when the absolute values of light absorption are >25%. Comparing these examples, the absolute IQE values tended to decrease with increasing Mn-co-doping and Gd-co-doping amounts. However, these examples still showed >85% IQE, which is necessary for practical lighting applications in general.

Figure 4A:
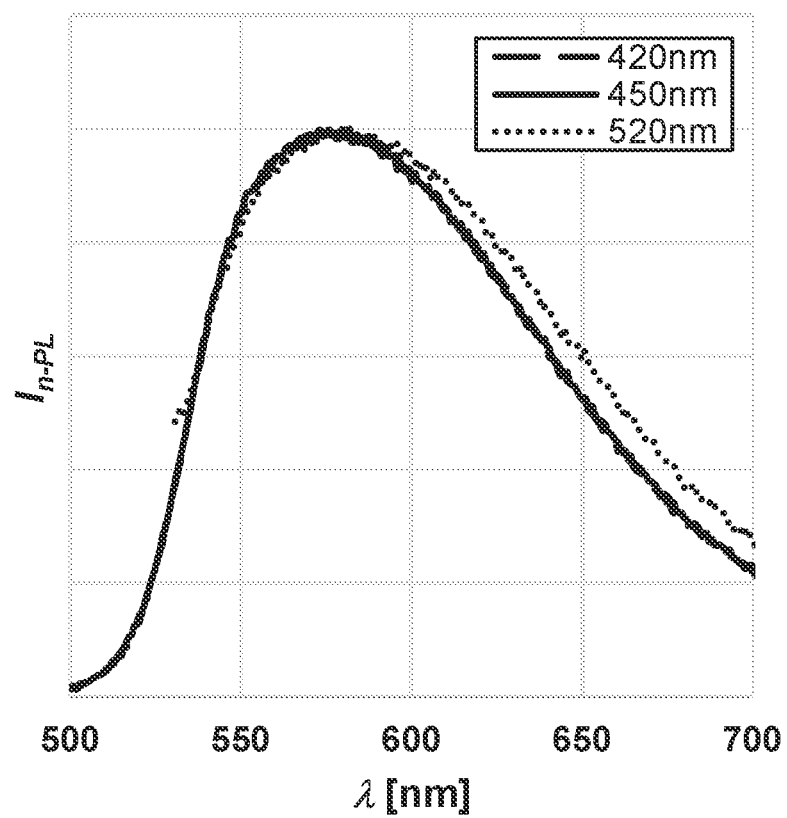
FIGS. 4A and 4B show the normalized emission spectra of Examples 2 and 5 depending on different excitation wavelengths at 420 nm, 450 nm, and 520 nm.
Figure 4B:
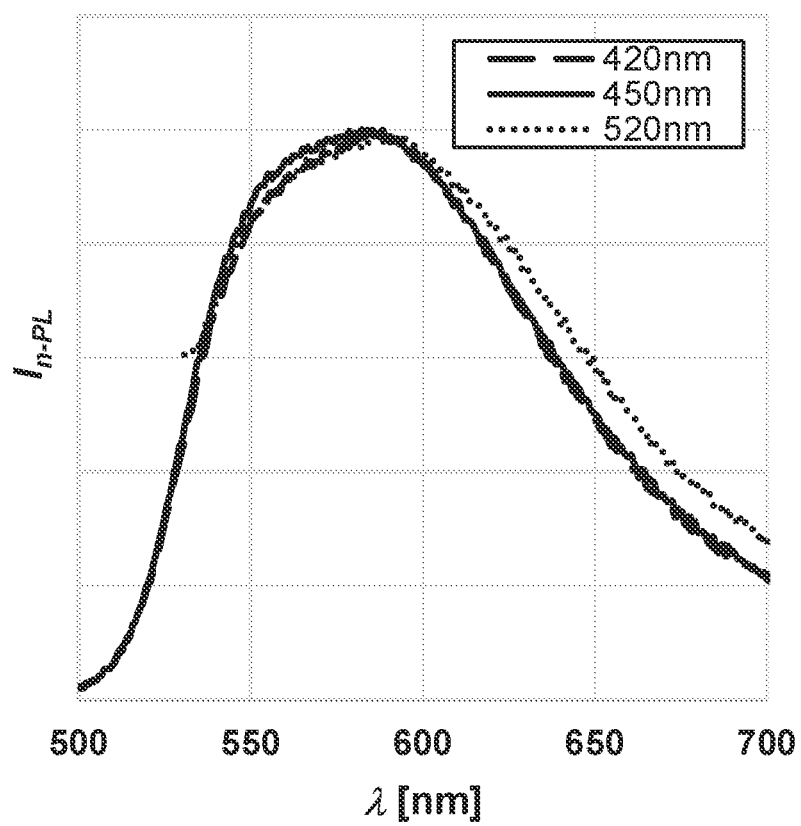

FIGS. 4A and 4B show the normalized emission spectra of Examples 2 (FIG. 4A) and 5 (FIG. 4B) depending on different excitation wavelengths. The excitation at 520 nm wavelength resulted in slightly red-shifted emission.

Figure 5A:
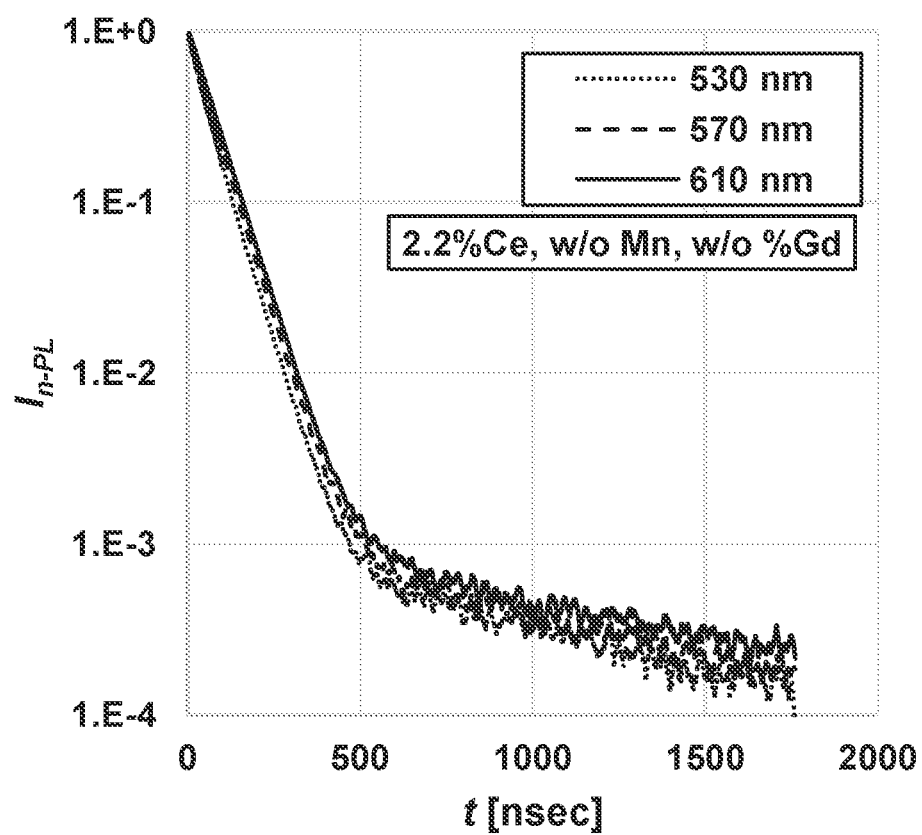
FIGS. 5A to 5E show decay time profiles of Examples 1, 2, and 5, as well as of Comparative Example 1.
Figure 5B:
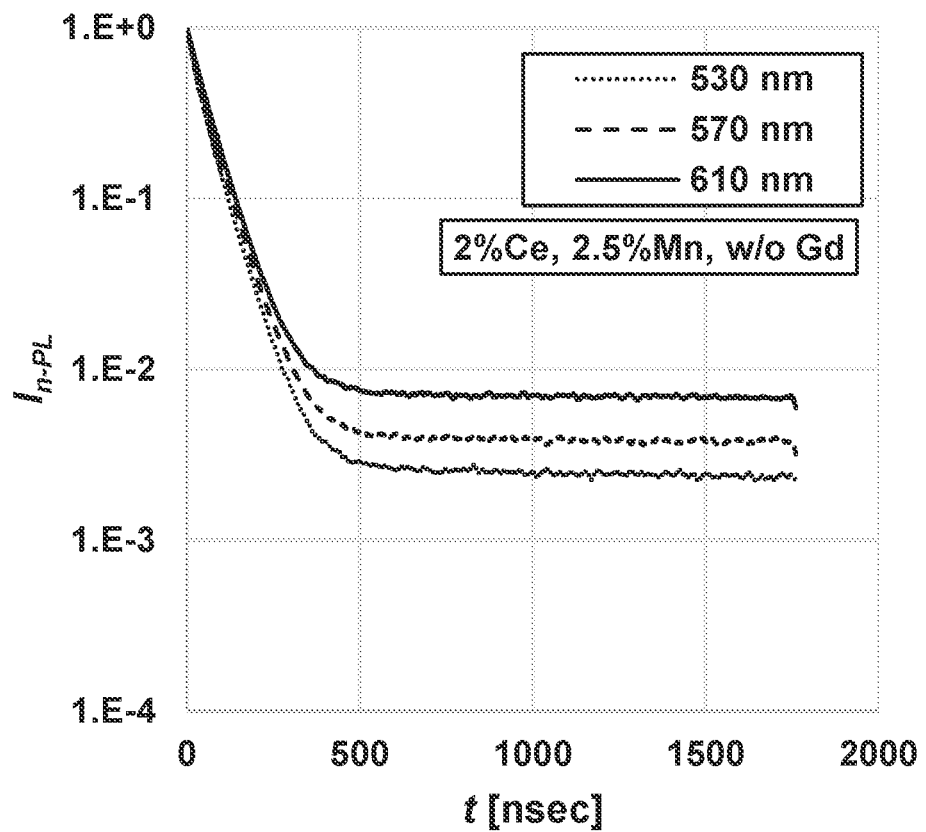
Figure 5C:
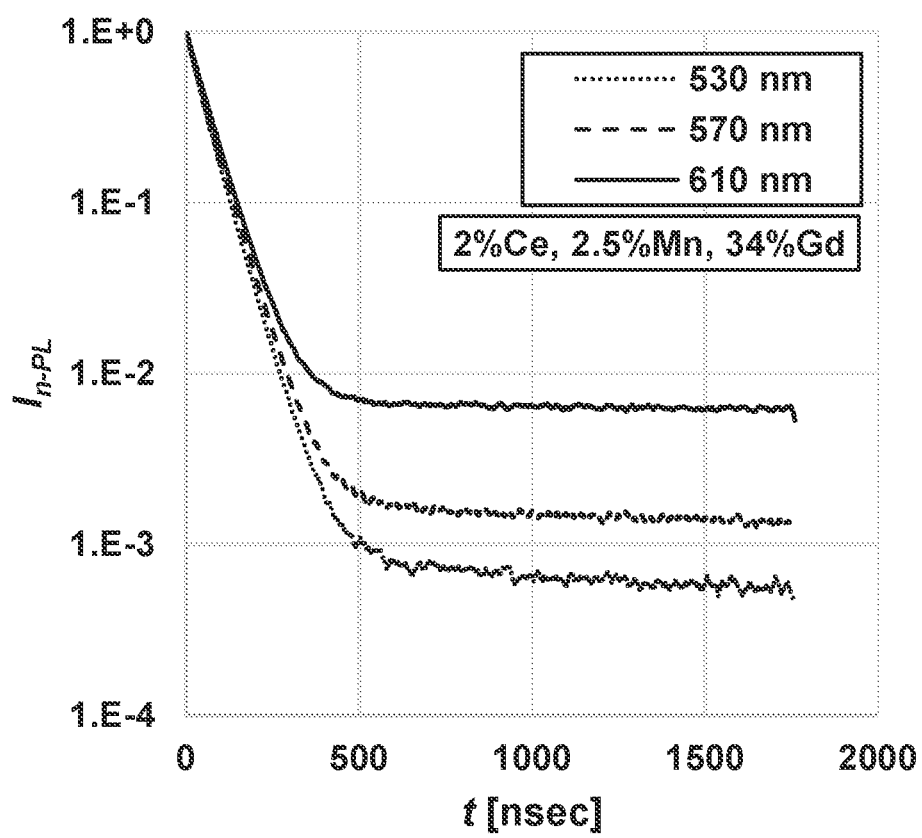
Figure 5D:
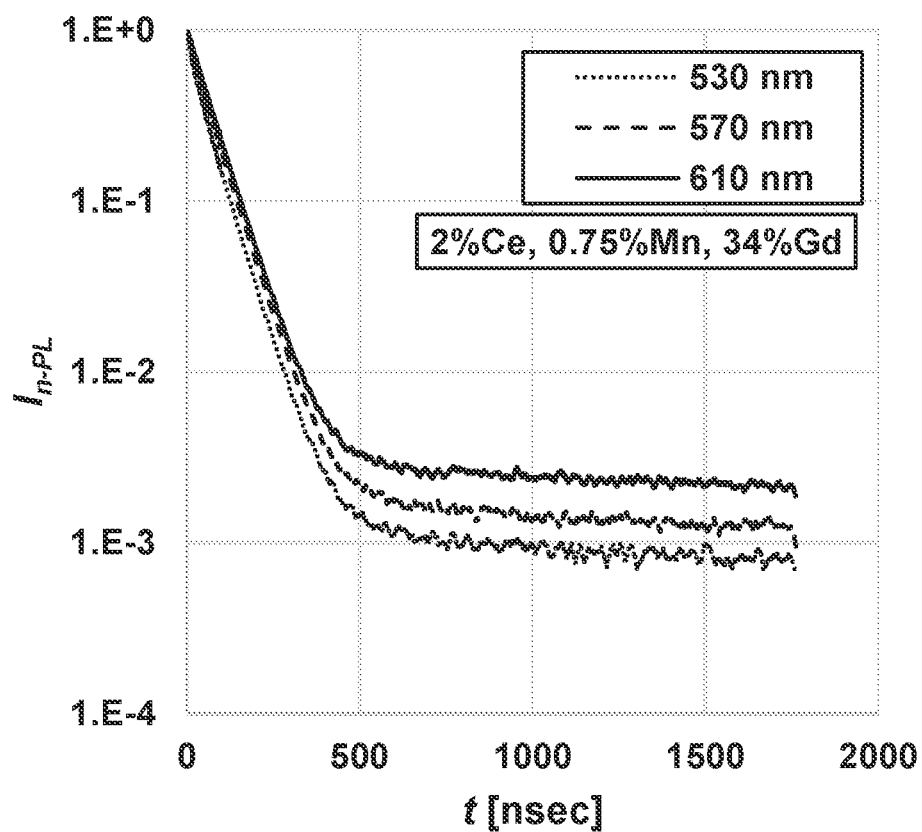
Figure 5E:
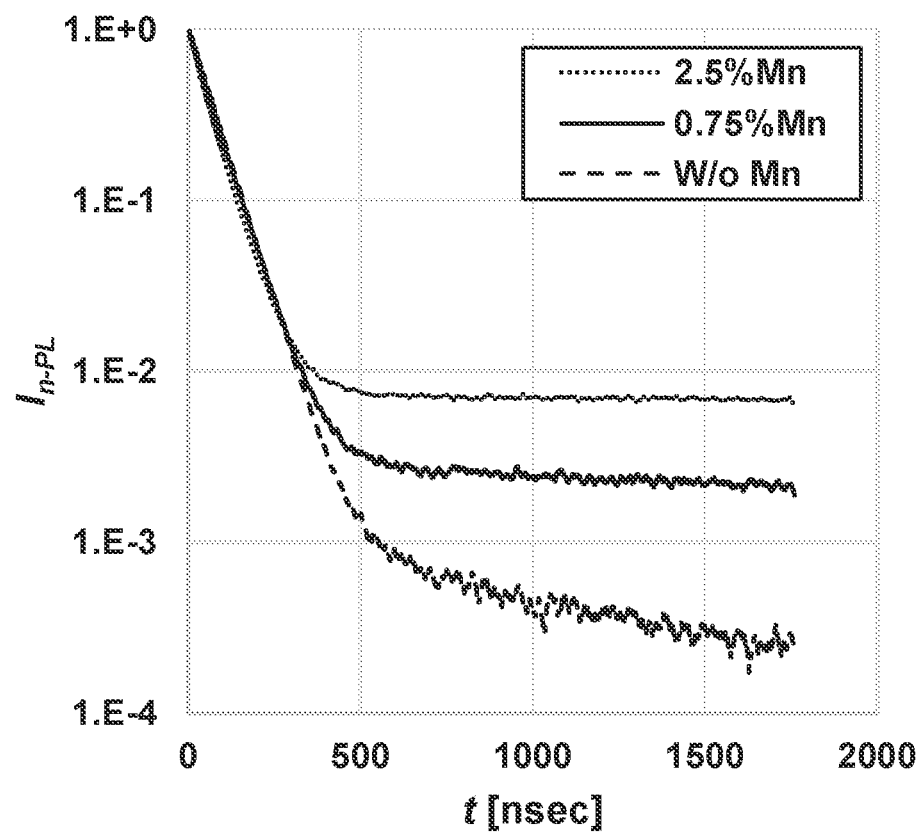

FIGS. 5A to 5E show the decay time profiles of Example 1, 2 and 5 as well as of Comparative Example 1. Ce-doping results in the short decay time in the nano second range, which is suitable for high power LED applications in general, and such decay curves were observed in FIG. 5A. When the Mn-co-doping was introduced in Example 1, the light intensity was saturated after 500 nanoseconds regardless of the emission wavelength between 530 nm and 610 nm as shown in FIG. 5B due to the Mn-co-doping, which is known to show the slow decay time in milli second range in general. Especially, the red light emission in 610 nm wavelength was significantly contributed from Mn-co-doping, thus the saturation level with 610 nm is much higher than shorter light wavelengths. Comparing between Examples 1 and 2, the light saturation after 500 nanoseconds was decreased especially for the emission at 530 nm and 570 nm wavelength as shown in FIG. 5C. This was because the red-shift light emission was introduced by not only Mn-co-doping but also Gd replacing Y in the garnet crystal. The decay curves of Example 5, in which the amount of Mn-co-doping was significantly reduced, are shown in FIG. 5D. The saturated red light intensity at 610 nm wavelength after 500 nanoseconds decreased compared with Examples 1 and 2 in FIGS. 5B and C. FIG. 5E shows that the degrees of saturated 610 nm emission light intensity after 500 nanoseconds decreased while reducing the amounts of Mn-co-doping.

Figure 6A:
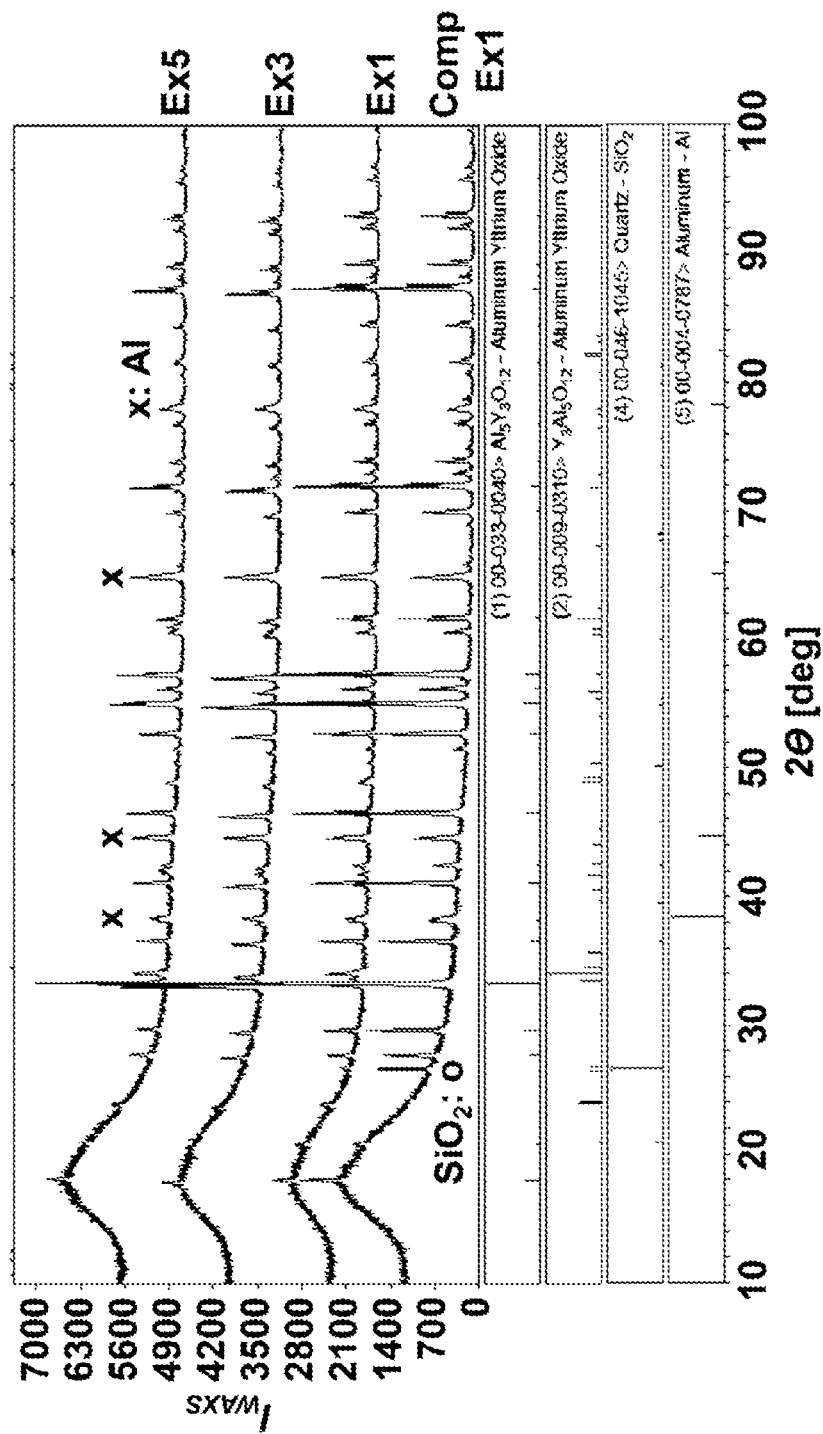
FIGS. 6A and 6B show wide-angle X-ray scattering (WAXS) plots of embodiments described in Examples 1, 3, 5, 9, and 12, and Comparative Examples 1 and 2.
Figure 6B:
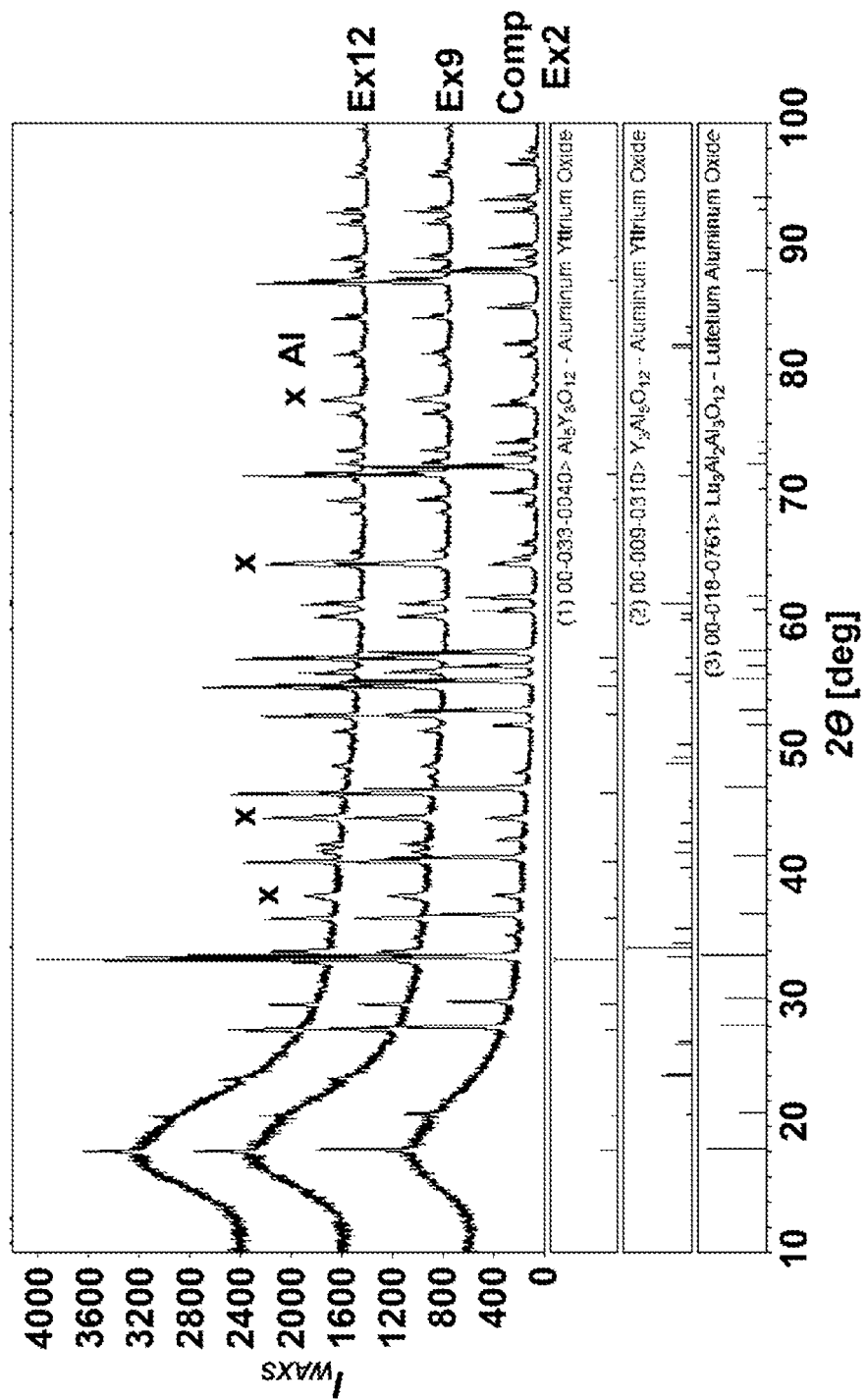

FIGS. 6A and 6B show wide-angle X-ray scattering (WAXS) plots of embodiments described in Examples 1, 3, 5, 9, and 12, and Comparative Examples 1 and 2. FIG. 6A refers to a comparison of Examples 1, 3, and 5, and Comparative Example 1, in which the main 8-coordination metallic element is yttrium (Y). The diffractions caused by the aluminum sample holder are shown with "x", whereas that caused by $SiO_2$ used as a sintering aid for Comparative Example 1 is shown with "o" in FIG. 6A. Except for these diffraction signals, all other diffractions showed garnet phase regardless of <35 at % Gd which replaced Y in the garnet crystal structure. FIG. 6B refers to a comparison of Examples 9 and 12, and Comparative Example 2, in which the main 8-coordination metallic element is lutetium (Lu). Except for the diffractions caused by the aluminum sample holder as shown with "x", all other diffractions show garnet phase regardless of <50 at % Gd which replaced Lu and Y in the garnet crystal structure.

Figure 7:
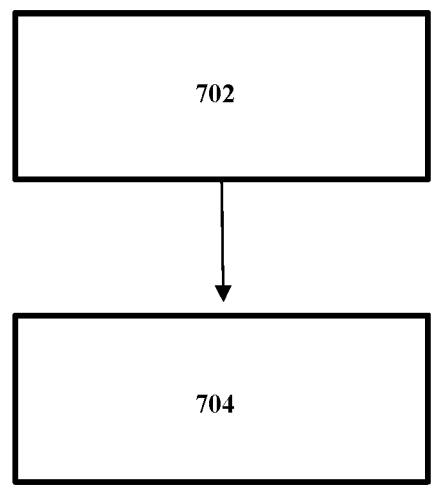
FIG. 7 refers to a method for preparing a phosphor.

FIG. 7 shows a method for preparing a phosphor. In a first step 702, a mixture of ceramic precursors is prepared. The ceramic precursors correspond to the ones described herein. In a subsequent step 704, the mixture of the ceramic precursors is heated at a temperature of higher than 1600° C.

Figure 8:
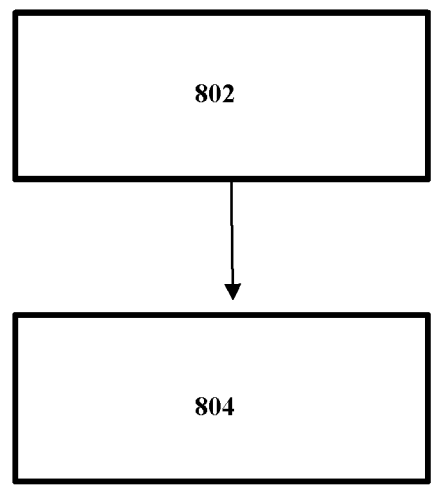
FIG. 8 refers to a method for preparing a light-emitting device.

FIG. 8 shows a method for preparing a light-emitting device. In a first step 802, a LED die is provided and in a subsequent step 804, a wavelength converting element, comprising a phosphor according to the present Disclosure is attached to the LED die.

Figure 9:
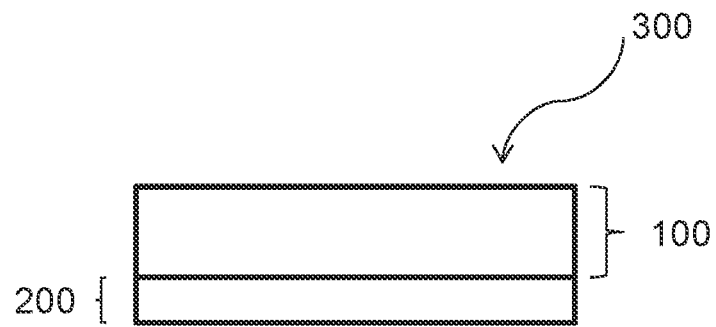
FIG. 9 shows a light-emitting device.

FIG. 9 shows a light emitting device 300 comprising a phosphor 100 of the present Disclosure and a LED die 200. The phosphor 100 corresponds to the phosphor of the general formula

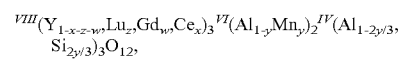

with the residues and the indices as described herein. The LED die 200 preferably emits blue light with an excitation wavelength of 450 nm.

Figure 10:
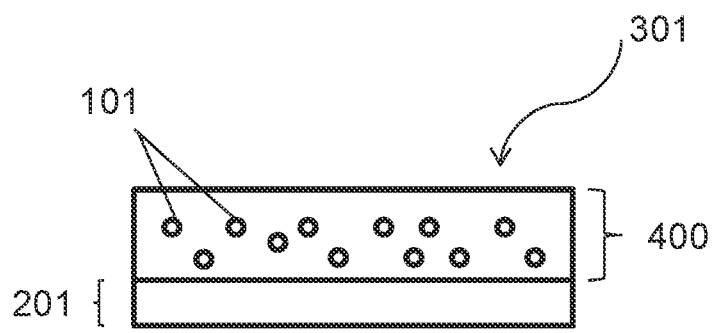
FIG. 10 shows a light-emitting device.

FIG. 10 shows a light emitting device 301 comprising a wavelength converting element 400 and a LED die 201. The wavelength converting element 400 comprises a phosphor 101 of the present Disclosure. The phosphor 101 may be intercalated in a matrix, e.g., a silicon matrix or glass, and thus the wavelength converting element 400 comprises a phosphor 101 and a matrix surrounding the phosphor 101. The phosphor 101 corresponds to the phosphor of the general formula

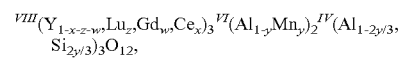

with the residues and the indices as described herein. The LED die 201 preferably emits blue light with an excitation wavelength of 450 nm.

EXAMPLES

Evaluation Method for Total Light Transmittance

Wavelength-dependent total light transmittance ($T_t$%) of the obtained phosphor as ceramic plates was measured using Perkin Elmer Lambda 900 UV/VIS/NIR spectrophotometer (Perkin Elmer Life and Analytical Sciences, Boston, MA). The TA spectrum was scanned between 475 nm and 800 nm with 5 nm increment. $T_t$% at 600 nm wavelength of light was used as a quantitative measure of the translucency of the obtained ceramics.

Evaluation method for absolute values of internal quantum efficiency (IQE) and emission spectra Wavelength-dependent absolute values of IQE of phosphor ceramics were measured using a Hamamatsu Photonics Quantaurus QY (Hamamatsu Photonics, Japan), based on the principle which is useful in general for characterizing phosphor materials as described in Ohkubo et al "Absolute Fluorescent Quantum Efficiency of NBS Phosphor Standard Samples", J. Illum. Engng. Inst. Jpn Vol 83, No. 2, 1999, pp. 87-93, and Ohkubo et al "Quantum Efficiency Measurement of Lamp Phosphor" J. Illum. Engng. Inst. Jpn Vol 95, No. 8A, 2011, pp. 431-438. The IQE is the ratio of the number of photons generated from the phosphor to the number of photons of excitation light that is absorbed by the phosphor. The absolute values of IQE were scanned between 360 nm and 560 nm with 10 nm increment, while the absolute IQE values were calibrated using yttrium aluminum garnet and lutetium aluminum garnet ceramics whose absolute values of IQE at 450 nm wavelength has been known. The emission spectra were also recorded with the excitation of 450 nm blue light, and the color coordination, dominant wavelength ($\lambda_{dom}$), and the peak wavelength of the emission spectra were further analyzed using the spectra above 478 nm wavelength.

Evaluation Method for Decay Time

The luminescence decay curves of 530 nm, 570 nm, and 610 nm light emissions were obtained by Horiba Jobin-Yvon Fluorolog3 spectrofluorometer equipped with nanoLED source of 460 nm wavelength excitation with a repetition rate of 500 kHz. The obtained decay curves were smoothened with 64 data points using the Savitzky-Golay method.

Evaluation Method for X-Ray Crystallography

Wide angle X-ray scattering (WAXS) technique was performed to characterize the crystal structures of the processed phosphor ceramic plates after the sintering process. Each specimen in the nominal size of 10×10×0.12 mm$^3$ was held with a scotch tape attached on the aluminum sample holder. WAXS spectra were obtained with a Shimadzu XRD-6100 General-purpose X-Ray Diffractometer (Cu Kα radiation with λ=0.15418 nm) operating at 40 kV and 30 mA at room temperature. The diffractogram step was 0.02° 2Θ, a count time at each angle of 2.0 sec, and a 2Θ range from 10-100°. The divergence and scatter slits set up for the Shimadzu XRD-6100 X-Ray Diffractometer for all measurements were 2.0°, and the receiving slit was 0.3 mm.

Exemplary method for obtaining phosphors described herein.

EXPERIMENTAL

Examples are summarized in Tables 1A, 1B, 1C, and 2 which depict the variances in actual chemical formulas of phosphor compositions with different doping percentages and doping elements, as well as changes in the slurry compositions as a part of phosphor ceramic processing. Phosphor ceramic plates with different chemical compositions were processed using the tape casting method. The experimental results, including total transmittance ($T_t$%), internal quantum efficiency (IQE), and crystal structures of the obtained phosphor ceramics, as well as color coordination, $\lambda_{dom}$, peak position, and decay time of light emission, were experimentally characterized. Some measured data are summarized in Table 2.

Wavelength-dependent total light transmittance ($T_t$%) of the obtained ceramic plates was measured using PerkinElmer Lambda 900 UV/VIS/MR spectrophotometer (PerkinElmer Life and Analytical Sciences, Waltham MA). The TA spectrum was scanned between 475 nm and 850 nm with 5 nm increment. $T_t$% at 600 nm wavelength of light was used as a quantitative measure of the translucency of the obtained ceramics.

Wavelength-dependent absolute values of IQE of phosphor ceramics were measured using a Hamamatsu Photonics Quantaurus QY (Hamamatsu Photonics, Japan), based on the principle which is useful in general for characterizing phosphor materials as described in Ohkubo et al "Absolute Fluorescent Quantum Efficiency of NBS Phosphor Standard Samples", J. Illum. Engng. Inst. Jpn Vol 83, No. 2, 1999, pp 87-93, and Ohkubo et al "Quantum Efficiency Measurement of Lamp Phosphor" J. Illum. Engng. Inst. Jpn Vol 95, No. 8A, 2011, pp 431-438. The IQE is the ratio of the number of photons generated from the phosphor to the number of photons of excitation light that is absorbed by the phosphor. The absolute values of IQE were scanned between 360 nm and 560 nm with 10 nm increment, while the absolute IQE values were calibrated using yttrium aluminum garnet and lutetium aluminum garnet ceramics whose absolute values of IQE at 450 nm wavelength has been known. The emission spectra were also recorded with the excitation of 450 nm blue light, and the color coordination, dominant wavelength ($\lambda_{dom}$), and the peak wavelength of the emission spectra were further analyzed using the spectra above 478 nm wavelength.

The luminescence decay curves of 530 nm, 570 nm, and 610 nm light emissions were obtained by Horiba Jobin-Yvon Fluorolog3 spectrofluorometer equipped with nanoLED source of 460 nm wavelength excitation with a repetition rate of 500 kHz. The obtained decay curves were smoothened with 64 data points using Savitzky-Golay method.

Example 1

In order to prepare 2.00 at % Ce- and 2.475 at % Mn-co-doped yttrium aluminum garnet phosphor ceramics, 19.04 g Al$_2$O$_3$ particles (Baikalox CR6, 99.99% purity, Baikowski S.A.S., France), 25.29 g Y$_2$O$_3$ particles (N-YT4CP, 99.99% purity, Nippon Yttrium Co., Ltd., Japan) which has been calcined at 1390° C. in air to adjust BET surface area to be approximately 3.0 g/m$^2$, 227 mg SiO$_2$ particles (S5505, 99.99% purity, MilliporeSigma, Burlington MA), 787 mg CeO$_2$ particles (N-CE$_3$CP, 99.9% purity, Nippon Yttrium Co., Ltd., Japan), 434 mg MnCO$_3$ particles (#40756, 99.985% purity, Alfa Aesar, Ward Hill MA), 7.20 g aqueous acrylic polymer solution (WB4101, Polymer Innovations, Vista CA) whose solid content is 35 wt % as a main component of polymeric binder for final green sheet, 846 mg 2-amino-2-methyl-1-propanol (AMP) plasticizer (PL008, Polymer Innovations, Vista CA), 85 mg deformer (DF002, Polymer Innovations, Vista CA) which is the mixture of 2,4,7,9-tetramethyl-5-decyne-4,7-diol ethoxylate (TMDE) and dipropylene glycol for aqueous slurry, and 16.00 g water treated by reverse osmosis system (RO-water) were added to a 4 oz (0.12 L) polypropylene (PP) thick wall jar, whose inner diameter is 80 mm (Parkway Plastics Inc., Piscataway, NJ, USA), for aqueous slurry preparation. 130 g Al$_2$O$_3$ milling media (99.9% purity, Nikkato Corporation, Japan) ranging in sizes from about 5 mm to about 10 mm diameter were added to the PP jar and then the contents were ball milled. After ball-milling for the initial 16 hours, additional 10.29 g of the same WB4101 aqueous acrylic polymer solution was added to the milled solution in the PP jar, and the mixture was further ball-milled for at least additional 2 hrs. Finally, 80.20 g slurry solution, containing 60.0 vol % ceramic content, was obtained.

The slurry was then cast on 75 μm thick silicone-coated polyethylene terephthalate Mylar substrate film using a 3-meter-long automated roll-to-roll tape caster (Pro Caster, HED International, Inc., Ringoes NJ) with a doctor blade at a cast rate of 200 mm/min. The gap of the doctor blade was adjusted depending on the desired green sheet thickness. The resulted tape thicknesses were about 47 and 42 microns thick with the doctor blade gap setting of 170 microns gap and 145 microns gap, respectively. The cast tape was dried at 60° C. for underbed heater and 95° C. for top air heater to obtain green tape.

The dried green tape was cut to be 50 mm×50 mm. Next, samples were constructed as consisting of 4 layers of 47 micron thick green sheet layers. Laminates were uniaxially pressed with a metallic mold at 111 kN (25000 lbf) at 85° C. for 15 min. using a hydraulic laboratory press (Carver Inc, Wabash IN). The uniaxial pressure was 44.5 MPa. The green laminates were then cut to the size of nominal 12.5 mm×12.5 mm cubic shape for de-binding and Bisque-firing.

As the next step, the polymeric binder was removed from the laminated samples. The laminated samples were sandwiched between $Al_2O_3$ porous cover plates (Maryland Ceramic & Steatite Co., Inc., Bel Air MD USA) in order to avoid the warping, cambering and bending of the laminated samples during the de-binding and Bisque-firing processes. Alternatively, a plurality of green laminate samples can be stacked between porous $Al_2O_3$ cover plates. The laminated samples were then heated to about 1200° C. for about 2 hrs in air using a box furnace (ST-1600C-666, SentroTech Corporation, Brea OH USA) for de-binding and Bisque-firing. The heating and cooling rate was 4.0° C./min. The de-binded/Bisque-fired samples were then fully sintered at either 1750° C., 1775° C., or 1800° C. for 5 hours in a forming gas atmosphere w/2 mol % $H_2$ gas at slightly higher than the atmospheric pressure (~835 Torr) using a high-temperature furnace (Series M60, Centorr Vacuum Industries, Nashua NH) whose components were made of tungsten and molybdenum. The heating rate of this sintering process was about 13.3° C./min (for T≤1200° C.), then about 3.3° C./min (1200° C.<T≤1500° C.), then about 2.5° C. (1500° C.<T≤1800° C.), whereas the cooling rate was about 21.7° C./min in order to minimize cracking during sintering. The result was 2.00 at % Ce- and 2.475 at % Mn-co-doped yttrium aluminum garnet phosphor ceramics.

Comparative Example 1

For Comparative Example 1, in order to prepare a 2.20 at % Ce-doped yttrium aluminum garnet phosphor plate, the samples in Comparative Example 1 were prepared by the same methodology as in Example 1, except of the following. 20.55 g $Al_2O_3$ particles, 26.71 g calcined $Y_2O_3$ particles, 10 mg $SiO_2$ particles as 200 wt. ppm sintering aid, 916 mg $CeO_2$ particles, 8.10 g WB4101 aqueous acrylic polymer solution, 890 mg AMP plasticizer, 89 mg deformer, and 22.50 g RO-water were added to a 4 oz PP thick wall jar for aqueous slurry preparation. After ball-milling for the initial 16 hours, additional 10.28 g of the same WB4101 aqueous acrylic polymer solution was added to the milled solution in the PP jar, and the mixture was further ball-milled for 4 hrs. Finally, 90.04 g slurry solution was obtained. The slurry was then tape-cast. The resulted tape thickness was about 14 microns thick with the doctor blade gap setting of 70 microns gap. The samples were constructed as consisting of 6 layers of 14 micron thick green sheet layers. The de-binded/Bisque-fired samples were then fully sintered at 1700° C. for 2 hours in a forming gas atmosphere. The result was 2.20 at % Ce-doped yttrium aluminum garnet phosphor ceramics.

Example 2

For Example 2, in order to prepare a 2.00 at % Ce- and 0.75 at % Mn-co-doped garnet phosphor plate in which 34.30 at % Y was replaced w/ Gd, samples in Example 2 were prepared using the same methodology as in Example 1, except of the following. 17.74 g $Al_2O_3$ particles, 15.11 g calcined $Y_2O_3$ particles, 13.06 g Gd2O3 particles (N-GD4CP, 99.99% purity, Nippon Yttrium Co., Ltd., Japan) which has been calcined at 1210 deg C. in air to adjust BET surface area to be approximately 3.0 g/m2, 63 mg $SiO_2$ particles, 723 mg $CeO_2$ particles, 121 mg $MnCO_3$ particles, 7.20 g WB4101 aqueous acrylic polymer solution, 793 mg AMP plasticizer, 79 mg deformer, and 16.00 g RO-water were added to a 4 oz (0.12 L) PP thick wall jar for aqueous slurry preparation. After ball-milling for the initial 16 hours, additional 9.19 g of the same WB4101 aqueous acrylic polymer solution was added to the milled solution in the PP jar, and the mixture was further ball-milled for at least additional 2 hrs. Finally, 80.08 g slurry solution was obtained. The slurry was then tape-cast. The resulted tape thickness was about 43 microns thick with the doctor blade gap setting of 170 microns gap. The samples were constructed as consisting of 4 layers of 43 micron thick green sheet layers. The de-binded/Bisque-fired samples were then fully sintered at 1775° C. for 5 hours in a forming gas atmosphere. The result was 2.00 at % Ce- and 0.75 at % Mn-co-doped garnet phosphor ceramics in which 34.30 at % Y was replaced w/ Gd.

Example 3

For Example 3, in order to prepare a 2.00 at % Ce- and 1.50 at % Mn-co-doped garnet phosphor plate in which 34.30 at % Y was replaced w/ Gd, samples in Example 3 were prepared using the same methodology as in Example 1, except of the following. 17.62 g $Al_2O_3$ particles, 15.09 g calcined $Y_2O_3$ particles, 13.05 g calcined $Gd_2O_3$ particles, 126 mg $SiO_2$ particles, 722 mg $CeO_2$ particles, 241 mg $MnCO_3$ particles, 7.20 g WB4101 aqueous acrylic polymer solution, 794 mg AMP plasticizer, 79 mg deformer, and 16.00 g RO-water were added to a 4 oz (0.12 L) PP thick wall jar for aqueous slurry preparation. After ball-milling for the initial 16 hours, additional 9.20 g of the same WB4101 aqueous acrylic polymer solution was added to the milled solution in the PP jar, and the mixture was further ball-milled for at least additional 2 hrs. Finally, 80.13 g slurry solution was obtained. The slurry was then tape-cast. The resulted tape thickness was about 43 microns thick with the doctor blade gap setting of 170 microns gap. The samples were constructed as consisting of 4 layers of 43 micron thick green sheet layers. The de-binded/Bisque-fired samples were then fully sintered at 1775° C. for 5 hours in a forming gas atmosphere. The result was 2.00 at % Ce- and 1.50 at % Mn-co-doped garnet phosphor ceramics in which 34.30 at % Y was replaced w/ Gd.

Example 4

For Example 4, in order to prepare a 2.00 at % Ce- and 1.125 at % Mn-co-doped garnet phosphor plate in which 34.30 at % Y was replaced w/ Gd, samples in Example 4 were prepared using the same tapes prepared for Examples 2 and 3. The samples were constructed as double layers of 43 micron thick green sheets used for Example 3 (1.50 at % Mn-co-doped) were located in the middle of the assembly and were sandwiched with 43 micron thick green sheets used for Example 2 (0.75 at % Mn-co-doped). This results in the layered assembly to be:

0.75 at % (Ex2)/1.50 at % (Ex3)/1.50 at % (Ex3)/0.75 at % (Ex2) for Mn-co-doping. Since it is known that the metallic elements significantly diffused to each other during the high temperature oxide ceramic sintering, the average 1.125 at % Mn-co-doping can be achieved after the samples were fully sintered at 1775° C. for 5 hours in a forming gas atmosphere; the result was 2.00 at % Ce- and 1.125 at % Mn-co-doped garnet phosphor ceramics in which 34.30 at % Y was replaced w/ Gd.

Example 5

For Example 5, in order to prepare a 2.00 at % Ce- and 2.475 at % Mn-co-doped garnet phosphor plate in which 34.30 at % Y was replaced w/ Gd, samples in Example 5 were prepared using the same methodology as in Example 1, except of the following. 17.46 g $Al_2O_3$ particles, 15.07 g calcined $Y_2O_3$ particles, 13.03 g calcined $Gd_2O_3$ particles, 208 mg $SiO_2$ particles, 721 mg $CeO_2$ particles, 398 mg $MnCO_3$ particles, 7.20 g WB4101 aqueous acrylic polymer solution, 795 mg AMP plasticizer, 79 mg deformer, and 16.00 g RO-water were added to a 4 oz (0.12 L) PP thick wall jar for aqueous slurry preparation. After ball-milling for the initial 16 hours, additional 9.23 g of the same WB4101 aqueous acrylic polymer solution was added to the milled solution in the PP jar, and the mixture was further ball-milled for at least additional 2 hrs. Finally, 80.19 g slurry solution was obtained. The slurry was then tape-cast. The resulted tape thickness was about 42 microns thick with the doctor blade gap setting of 170 microns gap. The samples were constructed as consisting of 4 layers of 42 micron thick green sheet layers. The result was 2.00 at % Ce- and 2.475 at % Mn-co-doped garnet phosphor ceramics in which 34.30 at % Y was replaced w/Gd.

Example 6

For Example 6, in order to prepare a 2.00 at % Ce- and 2.475 at % Mn-co-doped garnet phosphor plate in which 17.15 at % Y was replaced w/ Gd, samples in Example 6 were prepared using the same tapes prepared for Examples 1 and 5. The samples were constructed as double layers of 42 micron thick green sheets used for Example 5 (34.30 at % Gd) were located in the middle of the assembly and were sandwiched with 42 micron thick green sheets used for Example 1 (without Gd). This results in the layered assembly to be:

0 at % (Ex1)/34.30 at % (Ex5)/34.30 at % (Ex5)/0 at % (Ex1) for Gd. Green sheet laminates were assembled on a fresh Mylar film placed on thick polycarbonate plate, and this assembly was vacuum-bagged before isostatic pressing. The assembly was laminated using a cold isostatic press (CIP) at 42 MPa at 75° C. for 10 min. using an ILS-66 isostatic lamination press (Keko Equipment, užemberk, Slovenia). Since it is known that the metallic elements significantly diffused to each other during the high temperature oxide ceramic sintering, the average 17.15 at % Gd replacing Y in garnet crystal structure can be achieved after the samples were fully sintered at either 1775° C. or 1800° C. for 5 hours in a forming gas atmosphere; the result was 2.00 at % Ce- and 2.475 at % Mn-co-doped garnet phosphor ceramics in which 17.15 at % Y was replaced w/ Gd.

Example 7

For Example 7, in order to prepare a 2.00 at % Ce- and 2.475 at % Mn-co-doped garnet phosphor plate in which 17.15 at % Y was replaced w/ Gd, samples in Example 7 were prepared using the same methodology as in Example 6, except of the following. The samples were constructed as double layers of 42 micron thick green sheets used for Example 1 (without Gd) were located in the middle of the assembly and were sandwiched with 42 micron thick green sheets used for Example 5 (34.30 at % Gd). This results in the layered assembly to be:

34.30 at % (Ex5)/0 at % (Ex1)/0 at % (Ex1)/34.30 at % (Ex5) for Gd. It is likely that the ceramic surface in Example 7 is more Gd-rich, whereas that in Example 6 is less Gd-rich, due to the original compositions of the green sheets with or without Gd used for Examples 1 and 5.

Comparative Example 2

This Comparative Example 2 was conducted to make sure that the observations reported in U.S. Pat. No. 10,093,856B2 is experimentally repeatable. In order to prepare a 2.00 at % Ce- and 2.475 at % Mn-co-doped lutetium aluminum garnet phosphor plate, samples in Comparative Example 2 were prepared using the same methodology as in Example 1, except of the following. 18.15 g $Al_2O_3$ particles, 42.50 g $Lu_2O_3$ particles (N-LU4CP, 99.99% purity, Nippon Yttrium Co., Ltd., Japan) which has been calcined at 1375° C. in air to adjust BET surface area to be approximately 3.0 g/m², 216 mg $SiO_2$ particles, 750 mg $CeO_2$ particles, 413 mg $MnCO_3$ particles, 8.55 g WB4101 aqueous acrylic polymer solution, 782 mg AMP plasticizer, 78 mg deformer, and 16.15 g RO-water were added to a 4 oz (0.12 L) PP thick wall jar for aqueous slurry preparation. After ball-milling for the initial 16 hours, additional 7.60 g of the same WB4101 aqueous acrylic polymer solution was added to the milled solution in the PP jar, and the mixture was further ball-milled for at least additional 2 hrs. Finally, 95.19 g slurry solution was obtained. The slurry was then tape-cast. The resulted tape thickness was about 41~42 microns thick with the doctor blade gap setting of 170 microns gap. The samples were constructed as consisting of 4 layers of 41 micron thick green sheet layers. The de-binded/Bisque-fired samples were then fully sintered at either 1750° C., 1775° C., or 1800° C. for 5 hours in a forming gas atmosphere. The result was 2.00 at % Ce- and 2.475 at % Mn-co-doped lutetium aluminum garnet phosphor ceramics.

Comparative Example 3

This Comparative Example 3 was conducted to make sure that the observations reported in U.S. Pat. No. 10,093,856B2 is experimentally repeatable. In order to prepare a 3.00 at % Ce- and 2.475 at % Mn-co-doped lutetium aluminum garnet phosphor plate, samples in Comparative Example 3 were prepared using the same methodology as in Comparative Example 2, except of the following. 19.12 g $Al_2O_3$ particles, 44.32 g calcined $Lu_2O_3$ particles, 228 mg $SiO_2$ particles, 1186 mg $CeO_2$ particles, 436 mg $MnCO_3$ particles, 9.00 g WB4101 aqueous acrylic polymer solution, 824 mg AMP plasticizer, 82 mg deformer, and 17.00 g RO-water were added to a 4 oz (0.12 L) PP thick wall jar for aqueous slurry preparation. After ball-milling for the initial 16 hours, additional 8.03 g of the same WB4101 aqueous acrylic polymer solution was added to the milled solution in the PP jar, and the mixture was further ball-milled for at least additional 2 hrs. Finally, 100.22 g slurry solution was obtained. The slurry was then tape-cast. The resulted tape thickness was about 40 microns thick with the doctor blade gap setting of 170 microns gap. The samples were constructed as consisting of 4 layers of 40 micron thick green sheet layers. The de-binded/Bisque-fired samples were then fully sintered at 1700° C. for 5 hours in a forming gas atmosphere. The result was a 3.00 at % Ce- and 2.475 at % Mn-co-doped lutetium aluminum garnet phosphor ceramics.

Example 8

For Example 8, in order to prepare a 3.00 at % Ce- and 2.475 at % Mn-co-doped garnet phosphor plate in which 48.50 at % Lu was replaced w/ Gd, samples in Example 8 were prepared using the same methodology as in Comparative Example 3, except of the following. 18.18 g $Al_2O_3$ particles, 21.06 g calcined $Lu_2O_3$ particles, 19.19 g calcined $Gd_2O_3$, 216 mg $SiO_2$ particles, 1127 mg $CeO_2$ particles, 414 mg $MnCO_3$ particles, 8.55 g WB4101 aqueous acrylic polymer solution, 823 mg AMP plasticizer, 82 mg deformer, and 17.10 g RO-water were added to a 4 oz (0.12 L) PP thick wall jar for aqueous slurry preparation. After ball-milling for the initial 16 hours, additional 8.47 g of the same WB4101 aqueous acrylic polymer solution was added to the milled solution in the PP jar, and the mixture was further ball-milled for at least additional 2 hrs. Finally, 95.21 g slurry solution was obtained. The slurry was then tape-cast. The resulted tape thickness was about 35 microns thick with the doctor blade gap setting of 145 microns gap. The samples were constructed as consisting of 4 layers of 35 micron thick green sheet layers. The green sheet assembly was laminated using a cold isostatic press (CIP) at 42 MPa at 75° C. for 10 min using an ILS-66 isostatic lamination press. The debinded/Bisque-fired samples were then fully sintered at either 1700° C., 1750° C., 1800° C., or 1825° C. for 5 hours in a forming gas atmosphere. The result was 3.00 at % Ce- and 2.475 at % Mn-co-doped garnet phosphor ceramics in which 48.50 at % Lu was replaced w/ Gd.

Example 9

For Example 9, in order to prepare a 2.00 at % Ce- and 2.475 at % Mn-co-doped garnet phosphor plate in which 49.00 at % Lu was replaced w/ Gd, samples in Example 9 were prepared using the same methodology as in Example 8, except of the following. 18.17 g $Al_2O_3$ particles, 21.26 g calcined $Lu_2O_3$ particles, 19.37 g calcined $Gd_2O_3$, 216 mg $SiO_2$ particles, 751 mg $CeO_2$ particles, 414 mg $MnCO_3$ particles, 8.55 g WB4101 aqueous acrylic polymer solution, 823 mg AMP plasticizer, 82 mg deformer, and 17.10 g RO-water were added to a 4 oz (0.12 L) PP thick wall jar for aqueous slurry preparation. After ball-milling for the initial 16 hours, additional 8.46 g of the same WB4101 aqueous acrylic polymer solution was added to the milled solution in the PP jar, and the mixture was further ball-milled for at least additional 2 hrs. Finally, 95.19 g slurry solution was obtained. The slurry was then tape-cast. The resulted tape thickness was about 42 microns thick with the doctor blade gap setting of 170 microns gap. The samples were constructed as consisting of 4 layers of 42 micron thick green sheet layers. The debinded/Bisque-fired samples were then fully sintered at either 1775° C. or 1800° C. for 5 hours in a forming gas atmosphere. The result was 2.00 at % Ce- and 2.475 at % Mn-co-doped garnet phosphor ceramics in which 49.00 at % Lu was replaced w/ Gd.

Example 10

For Example 10, in order to prepare a 2.00 at % Ce- and 2.475 at % Mn-co-doped garnet phosphor plate in which 24.50 at % Lu was replaced w/ Gd, samples in Example 10 were prepared using the same tapes prepared for Comparative Example 2 and Example 9, based on the same methodology as in Example 6, except of the following. The samples were constructed as double layers of 42 micron thick green sheets used for Example 9 (49.00 at % Gd) were located in the middle of the assembly and were sandwiched with 42 micron thick green sheets used for Comparative Example 2 (without Gd). This results in the layered assembly to be:

0 at % (Comp Ex1)/49.00 at % (Ex9)/49.00 at % (Ex9)/0 at % (Comp Ex1) for Gd. The average 24.50 at % Gd replacing Lu in garnet crystal structure can be achieved after the samples were fully sintered; the result was a 2.00 at % Ce- and 2.475 at % Mn-co-doped garnet phosphor ceramics in which 24.50 at % Lu was replaced w/ Gd.

Example 11

For Example 11, in order to prepare a 2.00 at % Ce- and 2.475 at % Mn-co-doped garnet phosphor plate in which the metallic elements with 8-coordination consist of 42.467 at % Y, 16.333 at % Lu, and 39.20 at % Gd, the samples in Example 11 were prepared using the same methodology as in Example 9, except of the following. 17.55 g $Al_2O_3$ particles, 6.85 g calcined $Lu_2O_3$ particles, 10.11 g calcined $Y_2O_3$ particles, 14.98 g calcined $Gd_2O_3$, 209 mg $SiO_2$ particles, 726 mg $CeO_2$ particles, 400 mg $MnCO_3$ particles, 7.65 g WB4101 aqueous acrylic polymer solution, 798 mg AMP plasticizer, 80 mg deformer, and 17.00 g RO-water were added to a 4 oz (0.12 L) PP thick wall jar for aqueous slurry preparation. After ball-milling for the initial 16 hours, additional 8.84 g of the same WB4101 aqueous acrylic polymer solution was added to the milled solution in the PP jar, and the mixture was further ball-milled for at least additional 2 hrs. Finally, 85.19 g slurry solution was obtained. The result was a 2.00 at % Ce- and 2.475 at % Mn-co-doped garnet phosphor ceramics in the metallic elements with 8-coordination consist of 42.467 at % Y, 16.333 at % Lu, and 39.20 at % Gd.

Example 12

For Example 12, in order to prepare a 2.00 at % Ce- and 2.475 at % Mn-co-doped garnet phosphor plate in which the metallic elements with 8-coordination consist of 21.233 at % Y, 32.667 at % Lu, and 44.10 at % Gd, the samples in Example 12 were prepared using the same methodology as in Example 9, except of the following. 17.86 g $Al_2O_3$ particles, 13.94 g calcined $Lu_2O_3$ particles, 5.14 g calcined $Y_2O_3$ particles, 17.14 g calcined $Gd_2O_3$, 213 mg $SiO_2$ particles, 738 mg $CeO_2$ particles, 407 mg $MnCO_3$ particles, 8.10 g WB4101 aqueous acrylic polymer solution, 811 mg AMP plasticizer, 81 mg deformer, and 17.10 g RO-water were added to a 4 oz (0.12 L) PP thick wall jar for aqueous slurry preparation. After ball-milling for the initial 16 hours, additional 8.65 g of the same WB4101 aqueous acrylic polymer solution was added to the milled solution in the PP jar, and the mixture was further ball-milled for at least additional 2 hrs. Finally, 90.19 g slurry solution was obtained. The result was 2.00 at % Ce- and 2.475 at % Mn-co-doped garnet phosphor ceramics in the metallic elements with 8-coordination consist of 21.233 at % Y, 32.667 at % Lu, and 44.10 at % Gd.

Example 13

For Example 13, in order to prepare a 2.00 at % Ce- and 2.475 at % Mn-co-doped garnet phosphor plate in which the metallic elements with 8-coordination consist of 31.85 at % Y, 24.50 at % Lu, and 41.65 at % Gd, samples in Example 13 were prepared using the same tapes prepared for Examples 5 and 9, based on the same methodology as in Example 10, except of the following. The samples were constructed as double layers of 42 micron thick green sheets used for Example 9 (Lu-based) were located in the middle of the assembly and were sandwiched with 42 micron thick green sheets used for Example 5 (Y-based). This results in the layered assembly to be:

Y-based (Ex5)/Lu-based (Ex9)/Lu-based (Ex9)/Y-based (Ex5) for main metallic elements w/8-coordination. The garnet crystal structure in which the metallic elements with 8-coordination consist of average 31.85 at % Y, 24.50 at % Lu, and 41.65 at % Gd can be achieved after the samples were fully sintered.

Detailed compositions of all examples are summarized in Table 1. Sintering conditions, as well as the $T_t$%, IQE, color coordination, $\lambda_{dom}$, and the peak position of the light emission spectrum of each example are summarized in Table 2.

TABLE 1

A Variances of chemical compositions based on the general chemical formula:
$^{VIII}(Y_{1-x-z-w}, Lu_z, Gd_w, Ce_x)_3 \, ^{VI}(Al_{1-y}, Mn_y)_2 \, ^{IV}(Al_{1-2y/3}, Si_{2y/3})_3 \, O_{12}$

|          | (Y)     | x (Ce) | y (Mn)  | z (Lu)  | w (Gd) |
|----------|---------|--------|---------|---------|--------|
| Ex1      | 0.980   | 0.020  | 0.02475 | 0       | 0      |
| Comp Ex1 | 0.978   | 0.022  | 0       | 0       | 0      |
| Ex2      | 0.637   | 0.020  | 0.0075  | 0       | 0.343  |
| Ex3      | 0.637   | 0.020  | 0.015   | 0       | 0.343  |
| Ex4      | 0.637   | 0.020  | 0.01125 | 0       | 0.343  |
| Ex5      | 0.637   | 0.020  | 0.02475 | 0       | 0.343  |
| Ex6      | 0.8085  | 0.020  | 0.02475 | 0       | 0.1715 |
| Ex7      | 0.8085  | 0.020  | 0.02475 | 0       | 0.1715 |
| Comp Ex2 | 0       | 0.020  | 0.02475 | 0.980   | 0      |
| Comp Ex3 | 0       | 0.030  | 0.02475 | 0.970   | 0      |
| Ex8      | 0       | 0.030  | 0.02475 | 0.485   | 0.485  |
| Ex9      | 0       | 0.020  | 0.02475 | 0.490   | 0.490  |
| Ex10     | 0       | 0.020  | 0.02475 | 0.735   | 0.245  |
| Ex11     | 0.42467 | 0.020  | 0.02475 | 0.16333 | 0.392  |
| Ex12     | 0.21233 | 0.020  | 0.02475 | 0.32667 | 0.441  |
| Ex13     | 0.3185  | 0.020  | 0.02475 | 0.245   | 0.4165 |

B Actual chemical formula of all examples and comparative examples
Crystal Structure

| | |
|---|---|
| Ex1 | $^{VIII}(Y_{0.980}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Comp Ex1 | $^{VIII}(Y_{0.978}, Ce_{0.022})_3 \, ^{VI}Al_2 \, ^{IV}Al_3 \, O_{12}$ |
| Ex2 | $^{VIII}(Y_{0.637}, Gd_{0.343}, Ce_{0.020})_3 \, ^{VI}(Al_{0.9925}, Mn_{0.0075})_2 \, ^{IV}(Al_{0.995}, Si_{0.005})_3 \, O_{12}$ |
| Ex3 | $^{VIII}(Y_{0.637}, Gd_{0.343}, Ce_{0.020})_3 \, ^{VI}(Al_{0.985}, Mn_{0.015})_2 \, ^{IV}(Al_{0.99}, Si_{0.01})_3 \, O_{12}$ |
| Ex4 | $^{VIII}(Y_{0.637}, Gd_{0.343}, Ce_{0.020})_3 \, ^{VI}(Al_{0.98875}, Mn_{0.01125})_2 \, ^{IV}(Al_{0.9925}, Si_{0.0075})_3 \, O_{12}$ |
| Ex5 | $^{VIII}(Y_{0.637}, Gd_{0.343}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Ex6 | $^{VIII}(Y_{0.8085}, Gd_{0.1715}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Ex7 | $^{VIII}(Y_{0.8085}, Gd_{0.1715}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Comp Ex2 | $^{VIII}(Lu_{0.980}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Comp Ex3 | $^{VIII}(Lu_{0.970}, Ce_{0.030})_3 \, ^{VI}(Al_{0.97525}, Mn_{0.02475})_2 \, ^{IV}(Al_{0.9835}, Si_{0.0165})_3 \, O_{12}$ |
| Ex8 | $^{VIII}(Lu_{0.485}, Gd_{0.485}, Ce_{0.030})_3 \, ^{VI}(Al_{0.97525}, Mn_{0.02475})_2 \, ^{IV}(Al_{0.9835}, Si_{0.0165})_3 \, O_{12}$ |
| Ex9 | $^{VIII}(Lu_{0.490}, Gd_{0.490}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Ex10 | $^{VIII}(Lu_{0.735}, Gd_{0.245}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Ex11 | $^{VIII}(Y_{0.4247}, Lu_{0.1633}, Gd_{0.392}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Ex12 | $^{VIII}(Y_{0.2123}, Lu_{0.3267}, Gd_{0.441}, Ce_{0.020})_3 \, ^{VI}(Al_{0.97525}, Mn_{0.02475})_2 \, ^{IV}(Al_{0.9835}, Si_{0.0165})_3 \, O_{12}$ |
| Ex13 | $^{VIII}(Y_{0.3185}, Lu_{0.245}, Gd_{0.4165}, Ce_{0.020})_3 \, ^{VI}(Al_{0.97525}, Mn_{0.02475})_2 \, ^{IV}(Al_{0.9835}, Si_{0.0165})_3 \, O_{12}$ |

C Slurry compositions of all examples and comparative examples

| Examples | Al2O3, g | Lu2O3, g | Y2O3, g | Gd2O3, g | SiO2, mg | CeO2, mg | MnCO3, mg |
|----------|----------|----------|---------|----------|----------|----------|-----------|
| Ex1      | 19.04    | N/A      | 25.29   | N/A      | 227      | 787      | 434       |
| Comp Ex1 | 20.55    | N/A      | 26.71   | N/A      | 10       | 916      | N/A       |
| Ex2      | 17.74    | N/A      | 15.11   | 13.06    | 63       | 723      | 121       |
| Ex3      | 17.62    | N/A      | 15.09   | 13.05    | 126      | 722      | 241       |
| Ex5      | 17.46    | N/A      | 15.07   | 13.03    | 208      | 721      | 398       |
| Comp Ex2 | 18.15    | 42.50    | N/A     | N/A      | 216      | 750      | 413       |
| Comp Ex3 | 19.12    | 44.32    | N/A     | N/A      | 228      | 1186     | 436       |
| Ex8      | 18.18    | 21.06    | N/A     | 19.19    | 216      | 1127     | 414       |
| Ex9      | 18.17    | 21.26    | N/A     | 19.37    | 216      | 751      | 414       |
| Ex11     | 17.55    | 6.85     | 10.11   | 14.98    | 209      | 726      | 400       |
| Ex12     | 17.86    | 13.94    | 5.14    | 17.14    | 213      | 738      | 407       |

TABLE 1-continued

| Examples | WB4101 (1st addition), g | AMP (PL008), mg | DF002, mg | RO—water, g | WB4101 (2nd addition), g | Total amount, g | WB4101 (1st addition), g |
|---|---|---|---|---|---|---|---|
| Ex1 | 7.20 | 846 | 85 | 16.00 | 10.29 | 80.20 | 7.20 |
| Comp Ex1 | 8.10 | 890 | 89 | 22.50 | 10.28 | 90.04 | 8.10 |
| Ex2 | 7.20 | 793 | 79 | 16.00 | 9.19 | 80.08 | 7.20 |
| Ex3 | 7.20 | 794 | 79 | 16.00 | 9.20 | 80.13 | 7.20 |
| Ex5 | 7.20 | 795 | 79 | 16.00 | 9.23 | 80.19 | 7.20 |
| Comp Ex2 | 8.55 | 782 | 78 | 16.15 | 7.60 | 95.19 | 8.55 |
| Comp Ex3 | 9.00 | 824 | 82 | 17.00 | 8.03 | 100.22 | 9.00 |
| Ex8 | 8.55 | 823 | 82 | 17.10 | 8.47 | 95.21 | 8.55 |
| Ex9 | 8.55 | 823 | 82 | 17.10 | 8.46 | 95.19 | 8.55 |
| Ex11 | 7.65 | 798 | 80 | 17.00 | 8.84 | 85.19 | 7.65 |
| Ex12 | 8.10 | 811 | 81 | 17.10 | 8.65 | 90.19 | 8.10 |

TABLE 2

Process conditions and experimental results of all examples and comparative examples.

| | Green tape layers | Sintering temp, °C. | Ceramic thickness, μm | $T_t$ % @ 600 nm | IQE % @ 450 nm | Color coordination Cx | Color coordination Cy | $\lambda_{dom}$, nm | Spectra peak, nm |
|---|---|---|---|---|---|---|---|---|---|
| Ex1 | 47 μm × 4 layers | 1750 | 125 | 80% | 93% | 0.462 | 0.527 | 573 | 557 |
| | | 1775 | | 80% | 94% | 0.462 | 0.526 | 573 | 558 |
| | | 1800 | | 80% | 93% | 0.460 | 0.528 | 573 | 558 |
| Comp Ex1 | 14 μm × 6 layers | 1700 | 60 | 40% | 97% | 0.451 | 0.535 | 571 | 552 |
| Ex2 | 43 μm × 4 layers | 1775 | 120 | 82% | 91% | 0.506 | 0.488 | 579 | 582 |
| Ex3 | 43 μm × 4 layers | 1775 | 120 | 79% | 91% | 0.504 | 0.490 | 579 | 584 |
| Ex4 | 43/43 × 2/43 μm* | 1775 | 120 | 80% | 91% | 0.505 | 0.489 | 579 | 579 |
| Ex5 | 42 μm × 4 layers | 1750 | 110 | 75% | 81% | 0.502 | 0.491 | 579 | 583 |
| | | 1775 | | 76% | 87% | 0.500 | 0.494 | 579 | 582 |
| | | 1800 | | 75% | 87% | 0.500 | 0.494 | 579 | 582 |
| Ex6 | 42/42 × 2/42 μm* | 1775 | 115 | 80% | 94% | 0.484 | 0.508 | 576 | 585 |
| | | 1800 | | 81% | 94% | 0.484 | 0.508 | 576 | 582 |
| Ex7 | 42/42 × 2/42 μm* | 1775 | 115 | 78% | 93% | 0.487 | 0.506 | 577 | 582 |
| | | 1800 | | 79% | 92% | 0.488 | 0.505 | 577 | 584 |
| Comp Ex2 | 41 μm × 4 layers | 1750 | 120 | 76% | 92% | 0.410 | 0.559 | 566 | 543 |
| | | 1775 | | 75% | 93% | 0.410 | 0.559 | 566 | 541 |
| | | 1800 | | 73% | 91% | 0.409 | 0.560 | 566 | 546 |
| Comp Ex3 | 40 μm × 4 layers | 1700 | 120 | 80% | 83% | 0.416 | 0.554 | 567 | 544 |
| Ex8 | 35 μm × 4 layers | 1700 | 100 | 70% | 71% | 0.518 | 0.477 | 581 | 591 |
| | | 1750 | | 75% | 80% | 0.518 | 0.478 | 581 | 588 |
| | | 1800 | | 77% | 86% | 0.516 | 0.479 | 581 | 583 |
| | | 1825 | | 72% | 80% | 0.516 | 0.479 | 581 | 587 |
| Ex9 | 42 μm × 4 layers | 1775 | 120 | 77% | 82% | 0.513 | 0.481 | 581 | 588 |
| | | 1800 | | 76% | 83% | 0.514 | 0.481 | 581 | 588 |
| Ex10 | 42/42 × 2/42 μm* | 1775 | 115 | 84% | 90% | 0.481 | 0.509 | 576 | 569 |
| | | 1800 | | 84% | 91% | 0.481 | 0.509 | 576 | 570 |
| Ex11 | 42 μm × 4 layers | 1775 | 120 | 75% | 86% | 0.505 | 0.489 | 579 | 589 |
| | | 1800 | | 77% | 85% | 0.506 | 0.489 | 579 | 587 |
| Ex12 | 42 μm × 4 layers | 1775 | 120 | 76% | 86% | 0.509 | 0.485 | 580 | 587 |
| | | 1800 | | 75% | 86% | 0.509 | 0.486 | 580 | 586 |
| Ex13 | 42/42 × 2/42 μm* | 1775 | 120 | 78% | 86% | 0.508 | 0.486 | 580 | 585 |
| | | 1800 | | 78% | 87% | 0.508 | 0.487 | 580 | 591 |

*Combination of two different green sheets (see the respective Examples).

While there have been shown and described what are at present considered to be preferred embodiments of the Disclosure, it will be apparent to those skilled in the art that various changes and modifications can be made herein without departing from the scope of the Disclosure as defined by the appended claims. The disclosure rather comprises any new feature as well as any combination of features, which in particular includes any combination of features in the appended claims, even if the feature or combination is not per se explicitly indicated in the claims or the examples.

REFERENCE SIGNS

100, 101 Phosphor
200, 201 LED die
300, 301 light emitting device
400 wavelength converting element

What is claimed is:

1. A garnet phosphor ceramic, wherein the garnet phosphor has a formula:

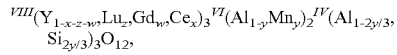

wherein
(i) $0 < x \leq 0.05$,
  $0.01 < y \leq 0.03$,
  $z = 0$,
  $0.15 < w < 0.40$, and
  a sintering temperature is in a range of 1750-1800° C. and an internal quantum efficiency in a range of 87-94%; or
(ii) $0.01 < x \leq 0.05$,
  $0.015 < y \leq 0.03$,
  $z > 0.4$,
  $0.25 \leq w < 0.5$,
  $1 - x - z - w = 0$, and
  a sintering temperature is at 1800° C. and a internal quantum efficiency in a range of 83-91%; or
(iii) $0.01 < x \leq 0.03$,
  $0.015 < y \leq 0.03$,
  $0.3 \leq w \leq 0.50$,
  $0.1 < z < 0.35$,
  $0.2 < 1 - x - z - w < 0.5$ and
  a sintering temperature is in a range of 1775-1800° C. and a internal quantum efficiency in a range of 85-87%.

2. The garnet phosphor ceramic according to claim 1, wherein
$0.3 \geq w \leq 0.50$ when $z \neq 0$, and
$0.15 \leq w \leq 0.35$ when $z = 0$.

3. The garnet phosphor ceramic according to claim 1, wherein the garnet phosphor has the formula in accordance with alternative (ii).

4. The garnet phosphor ceramic according to claim 1, wherein $0.015 \leq y \leq 0.025$.

5. The garnet phosphor ceramic according to claim 1, wherein the garnet phosphor is selected from a group consisting of $^{VIII}(Y_{0.637},Gd_{0.343},Ce_{0.020})_3{}^{VI}(Al_{0.985},Mn_{0.015})_2{}^{IV}(Al_{0.99},Si_{0.01})_3O_{12}$;

$^{VIII}(Y_{0.637},Gd_{0.343},Ce_{0.020})_3{}^{VI}(Al_{0.98875},Mn_{0.01125})_2{}^{IV}(Al_{0.9925},Si_{0.0075})_3O_{12}$;

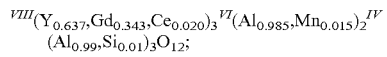

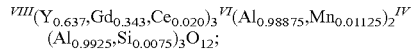

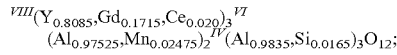

$^{VIII}(Lu_{0.485},Gd_{0.485},Ce_{0.030})_3{}^{VI}(Al_{0.97525},Mn_{0.02475})_2{}^{IV}(Al_{0.9835},Si_{0.0165})_3O_{12}$;

$^{VIII}(Lu_{0.490},Gd_{0.490},Ce_{0.020})_3{}^{VI}(Al_{0.97525},Mn_{0.02475})_2{}^{IV}(Al_{0.9835},Si_{0.0165})_3O_{12}$;

$^{VIII}(Lu_{0.735},Gd_{0.245},Ce_{0.020})_3{}^{VI}(Al_{0.97525},Mn_{0.02475})_2{}^{IV}(Al_{0.9835},Si_{0.0165})_3O_{12}$;

$VIII(Y_{0.425},Lu_{0.163},Gd_{0.392},Ce_{0.020})_3{}^{VI}(Al_{0.97525},Mn_{0.02475})_2{}^{IV}(Al_{0.9835},Si_{0.0165})_3O_{12}$;

$VIII(Y_{0.212},Lu_{0.327},Gd_{0.441},Ce_{0.020})_3{}^{VI}(Al_{0.97525},Mn_{0.02475})_2{}^{IV}(Al_{0.9835},Si_{0.0165})_3O_{12}$;

and $VIII(Y_{0.3185},Lu_{0.245},Gd_{0.4165},Ce_{0.020})_3{}^{VI}(Al_{0.97525},Mn_{0.02475})_2{}^{IV}(Al_{0.9835},Si_{0.0165})_3O_{12}$.

6. The garnet phosphor ceramic according to claim 1, wherein a dominant wavelength ($\lambda_{dom}$) of the light emission with 450 nm light excitation is within a range of 567 nm $< \lambda_{dom} <$ 590 nm.

7. The garnet phosphor ceramic according to claim 1, wherein a color coordination of a light emission of the garnet phosphor is within a range of $0.425 < Cx < 0.550$ and $0.425 < Cy < 0.550$.

8. A light emitting device comprising:
a LED die, and
at least one garnet phosphor ceramic, wherein the at least one garnet phosphor has a formula:

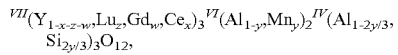

wherein
(i) $0 < x \leq 0.05$,
  $0.01 < y \leq 0.03$,
  $z = 0$,
  $0.15 < w < 0.40$, and
  a sintering temperature is in a range of 1750-1800° C. and an internal quantum efficiency in a range of 87-94%; or
(ii) $0.01 < x \leq 0.05$,
  $0.015 < y \leq 0.03$,
  $z > 0.4$,
  $0.2 \leq w < 0.5$,
  $1 - x - z - w = 0$, and
  a sintering temperature is at 1800° C. and a internal quantum efficiency in a range of 83-91%; or
(iii) $0.01 < x \leq 0.03$,
  $0.015 < y \leq 0.03$,
  $0.3 \leq w \leq 0.50$,
  $0.1 < z < 0.35$,
  $0.2 < 1 - x - z - w < 0.5$, and
  a sintering temperature is in a range of 1775-1800° C. and a internal quantum efficiency in a range of 85-87%.

9. A method for preparing a garnet phosphor ceramic with the garnet phosphor having a formula:

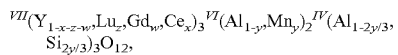

wherein
(i) $0<x\leq0.05$,
 $0.01<y\leq0.03$,
 $z=0$,
 $0.15<w<0.40$, and
 a sintering temperature is in a range of 1750-1800° C. and an internal quantum efficiency in a range of 87-94%; or
(ii) $0.01<x\leq0.05$,
 $0.015<y\leq0.03$,
 $z>0.4$,
 $0.2\leq w\leq0.5$,
 $1-x-z-w=0$, and
 a sintering temperature is at 1800° C. and a internal quantum efficiency in a range of 83-91%; or
(iii) $0.01<x\leq0.03$,
 $0.015<y\leq0.03$,
 $0.3\leq w\leq0.50$,
 $0.1<z<0.35$,
 $0.2<1-x-z-w<0.5$, and
 a sintering temperature is in a range of 1775-1800° C. and a internal quantum efficiency in a range of 85-87%
the method comprising:
preparing a mixture of inorganic and/or organic precursors,
wherein
the Y precursor is selected from nitrates, hydroxides, organometallic compounds, oxides, yttrium containing mixed oxides and combination thereof;
the Lu precursor is selected from nitrates, hydroxides, organometallic compounds, oxides, lutetium containing mixed oxides, and combination thereof;
the Gd precursor is selected from nitrates, hydroxides, organometallic compound, oxides, gadolinium containing mixed oxides, and combination thereof;
the Ce precursor is selected from nitrates, carbonates, hydroxides, organometallic compound, oxides, cerium containing mixed oxides, and combination thereof;
the Al precursor is selected from nitrates, hydroxides, organometallic compound, oxides, aluminum containing mixed oxides, and combination thereof;
the Mn precursor is selected from nitrates, carbonates, hydroxides, organometallic compound, oxides, cerium containing mixed oxides, and combination thereof; and
the Si precursor is selected from silicates, oxides, silicon containing mixed metal oxides and combination thereof; and sintering the mixture:
 at a temperature range of 1750-1800° C. for preparing the garnet phosphor ceramic with the garnet phosphor having the formula in accordance with alternative (i),
 at a temperature of 1800° C. for preparing the garnet phosphor ceramic with the garnet phosphor having the formula in accordance with alternative (ii) or
 at a temperature range of 1775-1800° C. for preparing the garnet phosphor ceramic with the garnet phosphor having the formula in accordance with alternative (iii).

10. The method according to claim 9, further comprising adding a polymeric binder to the mixture, prior to heating.

11. A method of preparing a light emitting device, the method comprising:
providing a LED die; and
attaching to the LED die a wavelength converting element, comprising a garnet phosphor ceramic wherein the garnet phosphor has a formula:

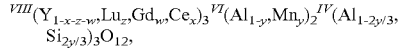

wherein
(i) $0<x\leq0.05$,
 $0.01<y\leq0.03$,
 $z=0$,
 $0.15<w<0.40$, and
 a sintering temperature is in a range of 1750-1800° C. and an internal quantum efficiency in a range of 87-94%; or
(ii) $0.01<x\leq0.05$,
 $0.015<y\leq0.03$,
 $z>0.4$,
 $0.2\leq w\leq0.5$,
 $1-x-z-w=0$, and
 a sintering temperature is at 1800° C. and a internal quantum efficiency in a range of 83-91%; or
(iii) $0.01<x\leq0.03$,
 $0.015<y\leq0.03$,
 $0.3\leq w\leq0.50$,
 $0.1<z<0.35$,
 $0.2<1-x-z-w<0.5$, and
 a sintering temperature is in a range of 1775-1800° C. and a internal quantum efficiency in a range of 85-87%.

* * * * *